United States Patent
Vellei et al.

(10) Patent No.: US 9,553,179 B2
(45) Date of Patent: Jan. 24, 2017

(54) SEMICONDUCTOR DEVICE AND INSULATED GATE BIPOLAR TRANSISTOR WITH BARRIER STRUCTURE

(71) Applicant: Infineon Technologies AG, Neubiberg (DE)

(72) Inventors: Antonio Vellei, Villach (AT); Johannes Georg Laven, Taufkirchen (DE); Roman Baburske, Otterfing (DE); Alexander Philippou, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/169,712

(22) Filed: Jan. 31, 2014

(65) Prior Publication Data

US 2015/0221756 A1    Aug. 6, 2015

(51) Int. Cl.
*H01L 29/47*    (2006.01)
*H01L 29/739*    (2006.01)
(Continued)

(52) U.S. Cl.
CPC ....... *H01L 29/7397* (2013.01); *H01L 29/0696* (2013.01); *H01L 29/1095* (2013.01);
(Continued)

(58) Field of Classification Search
CPC ...... H01L 21/00; H01L 27/00; H01L 29/0821; H01L 29/872; H01L 29/66143; H01L 29/00; H01L 21/8249; H01L 29/7397; H01L 29/7813; H01L 29/407; H01L 29/1095; H01L 29/66734; H01L 29/0834; H01L 29/41766
(Continued)

(56) References Cited

U.S. PATENT DOCUMENTS

| 4,893,160 A | 1/1990 | Blanchard |
| 4,985,741 A | 1/1991 | Bauer et al. |

(Continued)

FOREIGN PATENT DOCUMENTS

| CN | 1941417 A | 4/2007 |
| CN | 101185169 A | 5/2008 |

(Continued)

OTHER PUBLICATIONS

Blank, O., "Semiconductor Device Including a Gate Trench and a Source Trench," U.S. Appl. No. 13/856,689, filed Apr. 4, 2013.
(Continued)

*Primary Examiner* — Thao X Le
*Assistant Examiner* — Nduka Ojeh
(74) *Attorney, Agent, or Firm* — Murphy, Bilak & Homiller, PLLC

(57) ABSTRACT

A semiconductor device includes a semiconductor mesa which is formed between cell trench structures extending from a first surface into a semiconductor body. The semiconductor mesa includes a body zone forming a first pn junction with a drift zone between the body zone and a second surface opposite to the first surface. Source zones are arranged along a longitudinal axis of the semiconductor mesa at a first distance from each other and form second pn junctions with the body zone. A barrier structure, which has the conductivity type of the source zones, forms at least one of a unipolar homojunction with the drift zone and a pn junction with the body zone at least outside a vertical projection of the source zones perpendicular to the first surface. The barrier structure may be absent in the vertical projection of the source zones.

24 Claims, 18 Drawing Sheets

(51) Int. Cl.
*H01L 29/10* (2006.01)
*H01L 29/06* (2006.01)
*H01L 29/36* (2006.01)
*H01L 29/40* (2006.01)

(52) U.S. Cl.
CPC ............ *H01L 29/36* (2013.01); *H01L 29/407* (2013.01); *H01L 29/0688* (2013.01); *H01L 29/7396* (2013.01)

(58) Field of Classification Search
USPC ................................ 257/471–486, 607–612, E29.001,257/E29.066, E29.197, E29.262, E21.41; 438/133, 208, 220, 356, 570, 270, 589, 438/FOR. 122, FOR. 123, FOR. 149
See application file for complete search history.

(56) References Cited

U.S. PATENT DOCUMENTS

| | | |
|---|---|---|
| 5,366,914 A | 11/1994 | Takahashi et al. |
| 5,751,024 A | 5/1998 | Takahashi |
| 5,973,160 A | 10/1999 | Poss et al. |
| 6,218,217 B1 | 4/2001 | Uenishi et al. |
| 6,521,538 B2 | 2/2003 | Soga et al. |
| 6,566,691 B1 | 5/2003 | Inoue et al. |
| 6,710,403 B2 | 3/2004 | Sapp |
| 6,750,508 B2 | 6/2004 | Omura et al. |
| 6,800,897 B2 | 10/2004 | Baliga |
| 6,882,004 B2 | 4/2005 | Zundel et al. |
| 7,041,559 B2 | 5/2006 | Baliga |
| 7,078,740 B2 | 7/2006 | Yamaguchi et al. |
| 7,423,316 B2 | 9/2008 | Kawaji et al. |
| 7,456,487 B2 | 11/2008 | Ogura et al. |
| 7,546,487 B2 | 6/2009 | Marisetty et al. |
| 7,675,113 B2 | 3/2010 | Sakamoto et al. |
| 7,986,003 B2 | 7/2011 | Aono et al. |
| 8,120,074 B2 | 2/2012 | Schulze et al. |
| 8,178,701 B2 | 5/2012 | Selifonov |
| 8,178,947 B2 | 5/2012 | Takahashi et al. |
| 8,222,681 B2 | 7/2012 | Schulze et al. |
| 8,299,539 B2 | 10/2012 | Kouno |
| 8,319,314 B2 | 11/2012 | Ogura et al. |
| 2002/0179976 A1 | 12/2002 | Takahashi |
| 2004/0009643 A1 | 1/2004 | Blanchard |
| 2004/0014451 A1 | 1/2004 | Sapp et al. |
| 2004/0079989 A1 | 4/2004 | Kaneko et al. |
| 2004/0173813 A1 | 9/2004 | Chang |
| 2006/0060916 A1 | 3/2006 | Girdhar et al. |
| 2007/0194374 A1 | 8/2007 | Bhalla et al. |
| 2007/0272978 A1* | 11/2007 | Mauder ............... H01L 29/0834 257/330 |
| 2008/0179662 A1 | 7/2008 | Hshieh |
| 2008/0265315 A1* | 10/2008 | Mauder ............... H01L 29/1095 257/330 |
| 2009/0114982 A1 | 5/2009 | Saka et al. |
| 2009/0140327 A1 | 6/2009 | Hirao et al. |
| 2010/0078707 A1* | 4/2010 | Haeberlen ........... H01L 29/7813 257/328 |
| 2010/0171173 A1 | 7/2010 | Hsieh |
| 2010/0193796 A1 | 8/2010 | Nakano |
| 2010/0258855 A1 | 10/2010 | Yilmaz et al. |
| 2010/0289032 A1* | 11/2010 | Zhang ................. H01L 21/0465 257/77 |
| 2011/0101416 A1 | 5/2011 | Schulze et al. |
| 2011/0248340 A1 | 10/2011 | Hsieh |
| 2011/0254088 A1 | 10/2011 | Darwish et al. |
| 2011/0298056 A1* | 12/2011 | Ning ................. H01L 21/28518 257/384 |
| 2011/0303925 A1 | 12/2011 | Nishimura et al. |
| 2011/0316074 A1 | 12/2011 | Oota |
| 2012/0025199 A1 | 2/2012 | Chen et al. |
| 2012/0032258 A1* | 2/2012 | Zeng ................... H01L 29/0634 257/330 |
| 2012/0056241 A1 | 3/2012 | Sumitomo et al. |
| 2012/0098030 A1 | 4/2012 | Schulze et al. |
| 2012/0313139 A1* | 12/2012 | Matsuura ................ H01L 29/36 257/139 |
| 2012/0319199 A1 | 12/2012 | Zeng et al. |
| 2012/0322217 A1 | 12/2012 | Yeh et al. |
| 2013/0248992 A1 | 9/2013 | Padmanabhan et al. |
| 2014/0061719 A1 | 3/2014 | Takei |
| 2014/0332844 A1 | 11/2014 | Ding et al. |

FOREIGN PATENT DOCUMENTS

| | | |
|---|---|---|
| CN | 101266948 A | 9/2008 |
| CN | 102856208 A | 1/2013 |
| DE | 102004057791 A1 | 6/2006 |
| DE | 102006049043 B4 | 3/2011 |
| DE | 102005052734 B4 | 2/2012 |
| EP | 0881692 A2 | 12/1998 |
| EP | 1353385 A1 | 10/2003 |

OTHER PUBLICATIONS

Laven, J G. et al., "Semiconductor Device with Cell Trench Structures and Contacts and Method of Manufacturing a Semiconductor Device", U.S. Appl. No. 13/963,312, filed Aug. 9, 2013.

Laven, J. G. et al., "Semiconductor Device and Insulated Gate Bipolar Transistor with Barrier Regions", U.S. Appl. No. 14/091,955, filed Nov. 27, 2013.

Laven, J. G. et al., "Semiconductor Device with Cell Trench Structures and Contacts and Method of Manufacturing a Semiconductor Device", U.S. Appl. No. 14/092,312, filed Nov. 27, 2013.

Sumitomo, M et al., "Injection Control Technique for High Speed Switching with a double gate PNM-IGBT", Proceedings of the 25th International Symposium on Power Semiconductor Devices & ICs, May 2013. pp. 33-36, Kanazawa.

Sumitomo, M. et al., "Low loss IGBT with Partially Narrow Mesa Structure (PNM-IGBT)", Proceedings of the 2012 24th International Symposium on Power Semiconductor Devices and ICs, Jun. 3-7, 2012, pp. 17-20, Bruges.

Nakano, et al. "600V trench-gate IGBT with Micro-P structure." IEEE, 2009. pp. 132-135.

Laven, et al. "Insulated Gate Bipolar Transistor with Mesa Sections Between Cell Trench Structures and Method of Manufacturing." U.S. Appl. No. 14/026,383, filed Sep. 13, 2013.

* cited by examiner

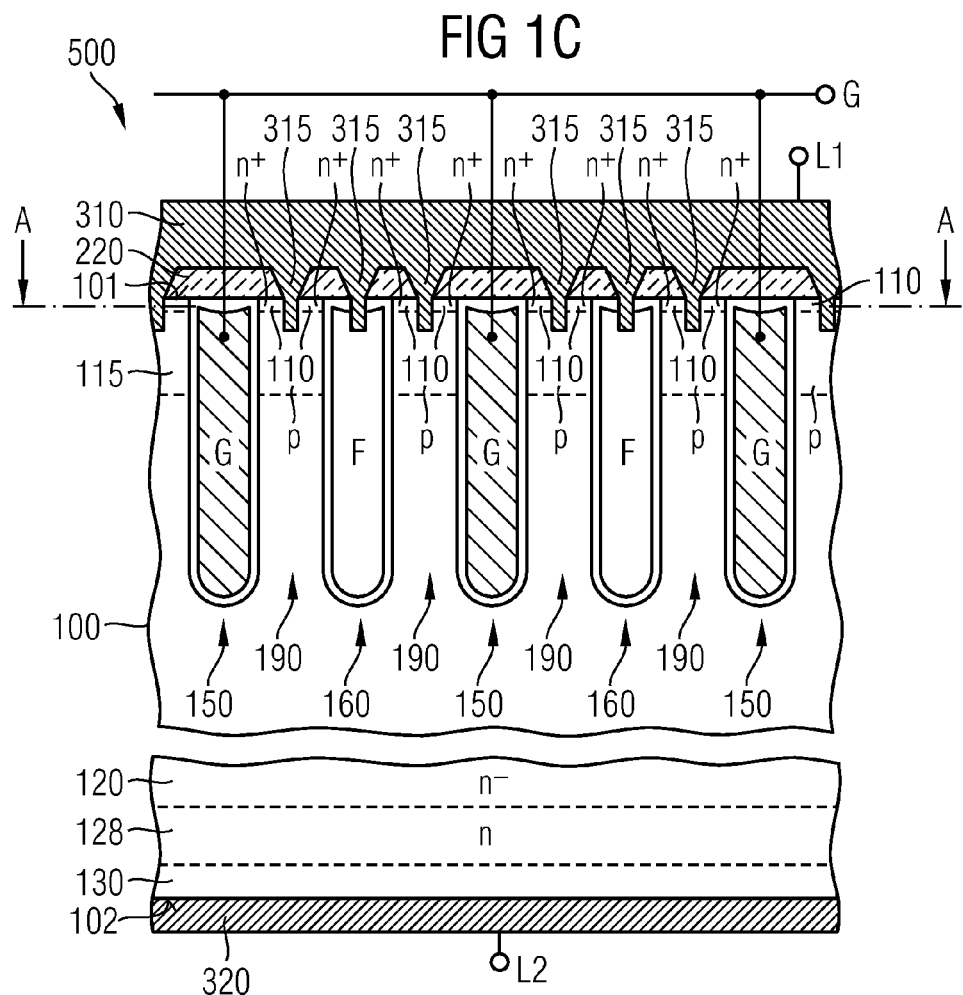
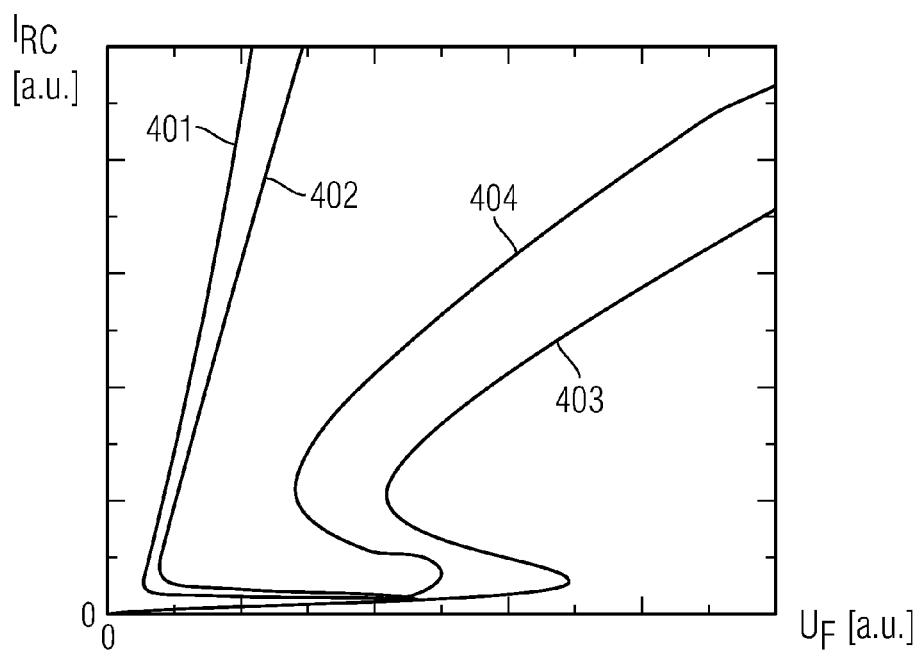

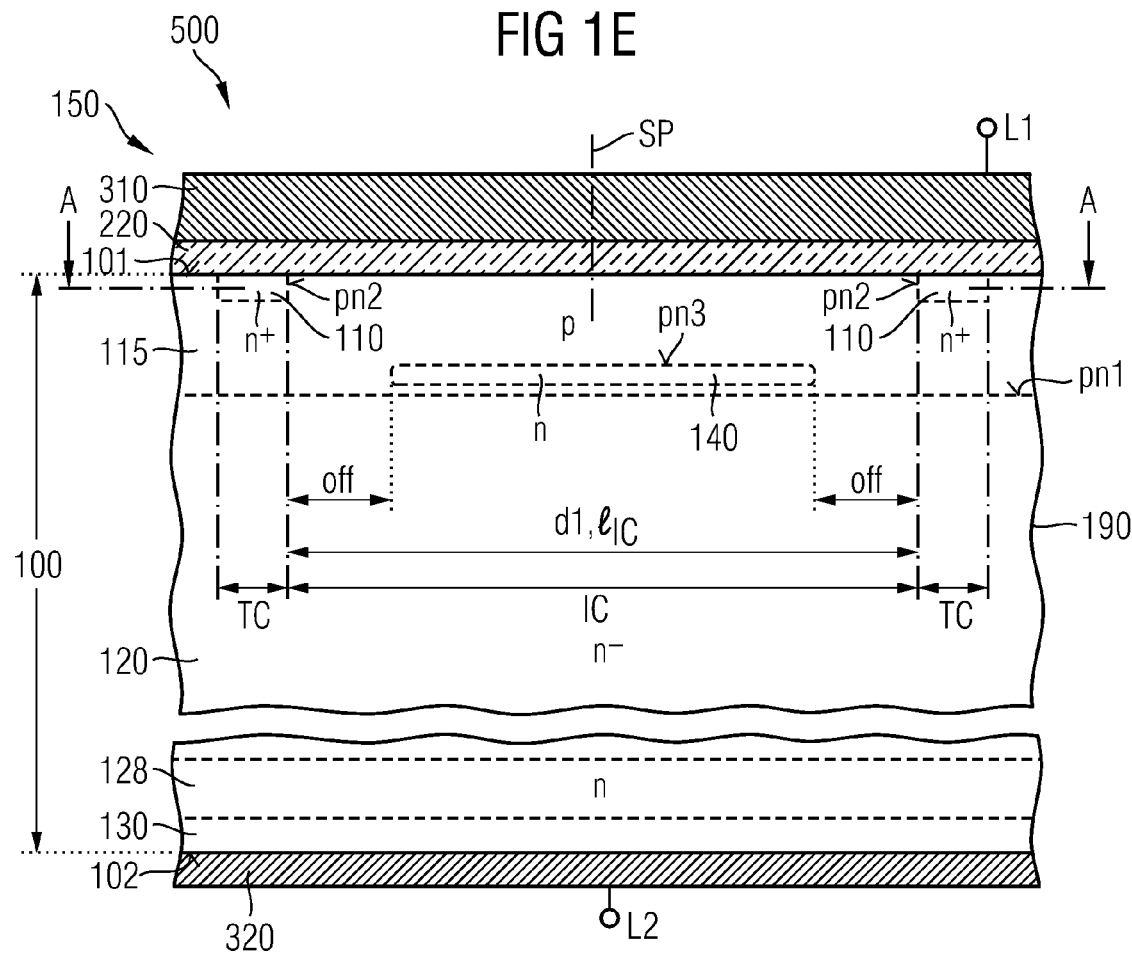

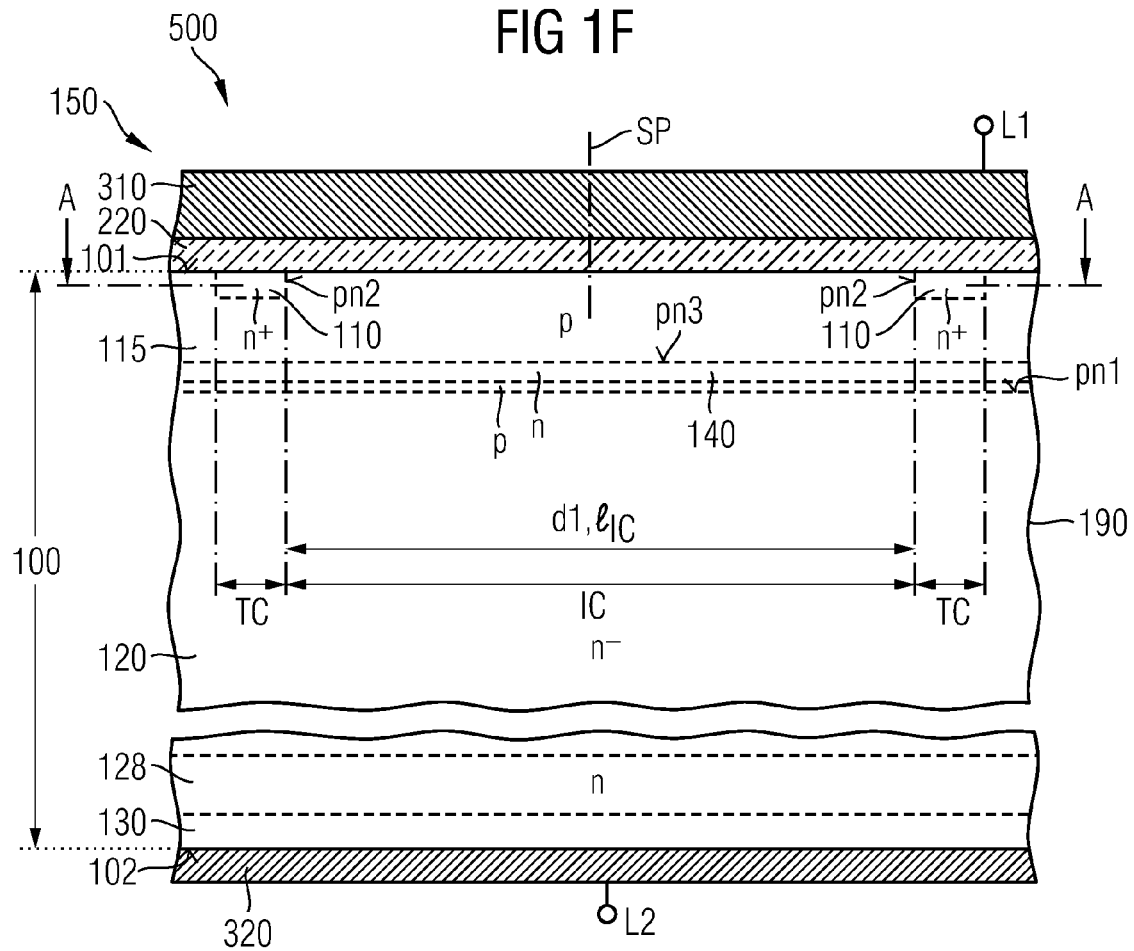

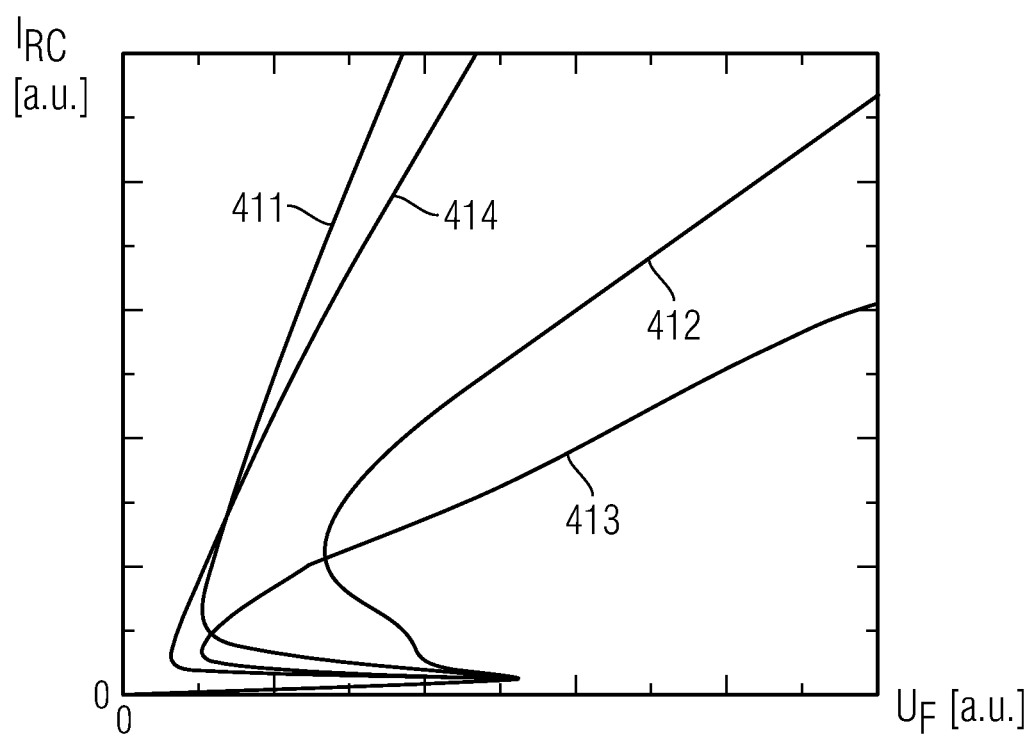

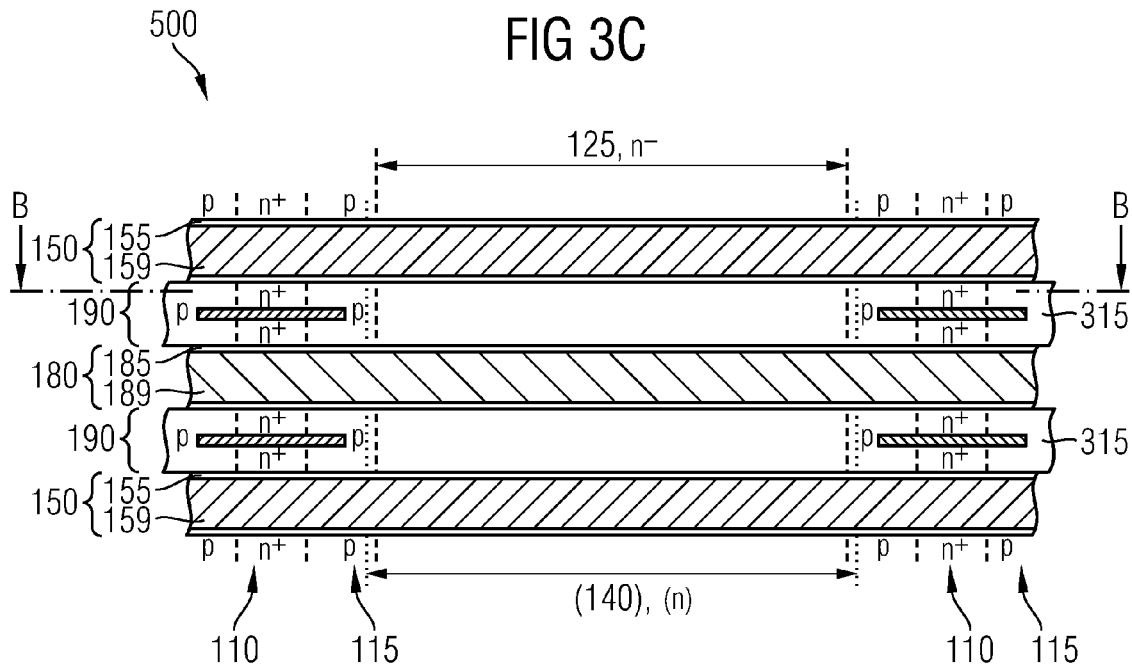
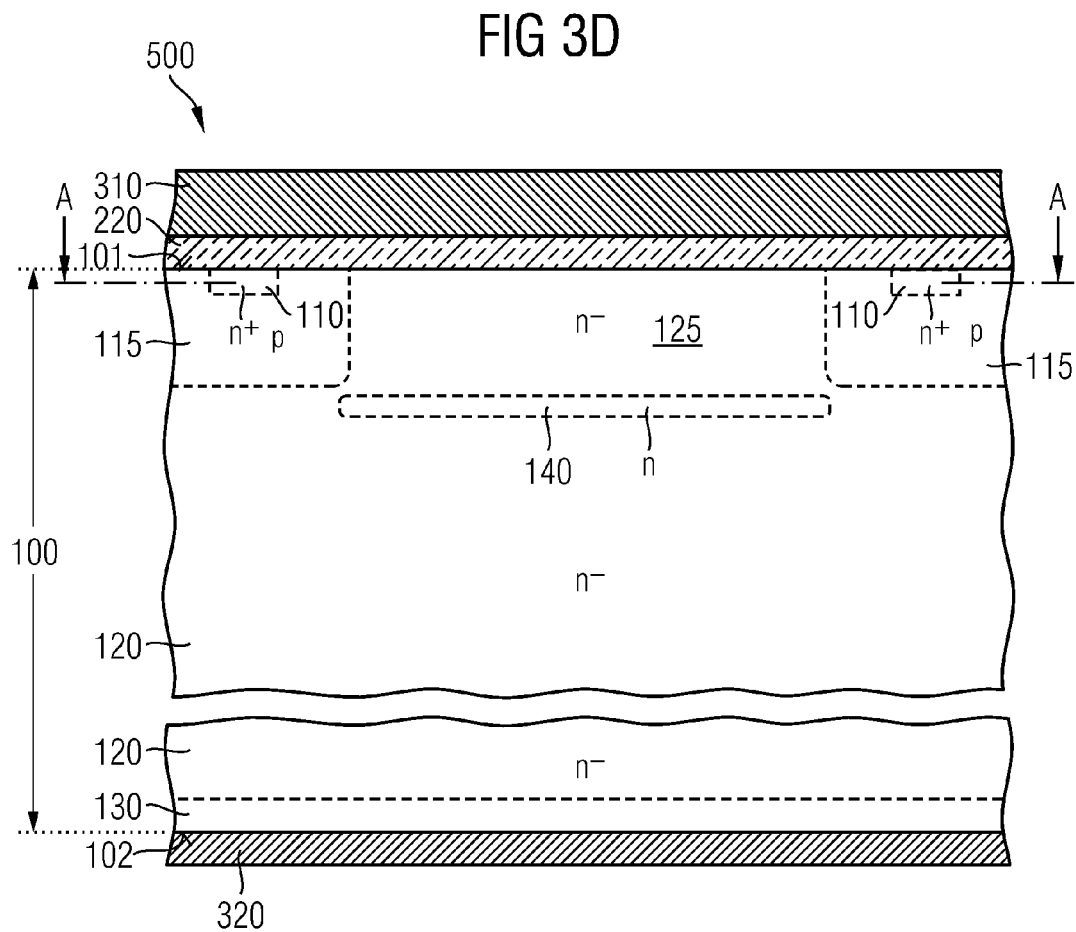

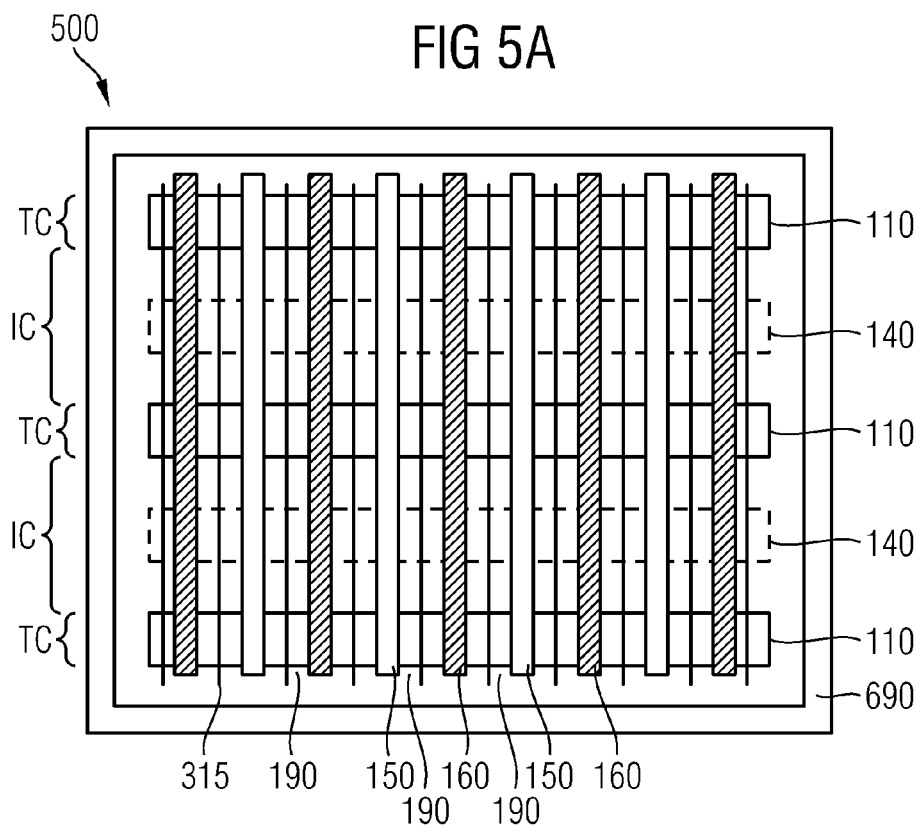
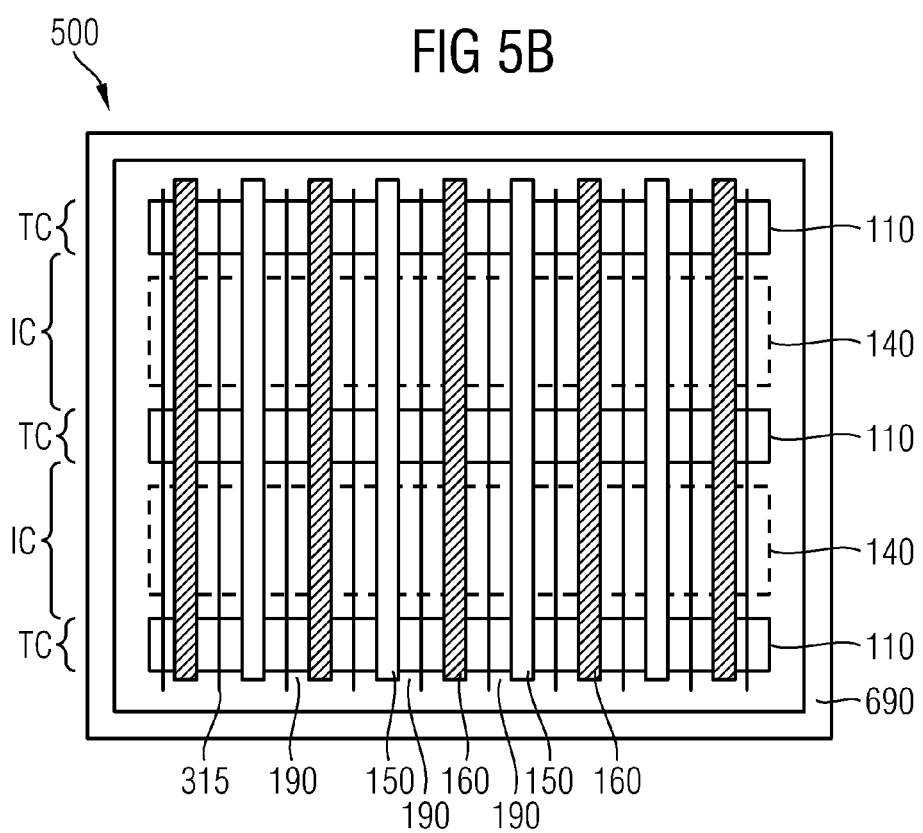

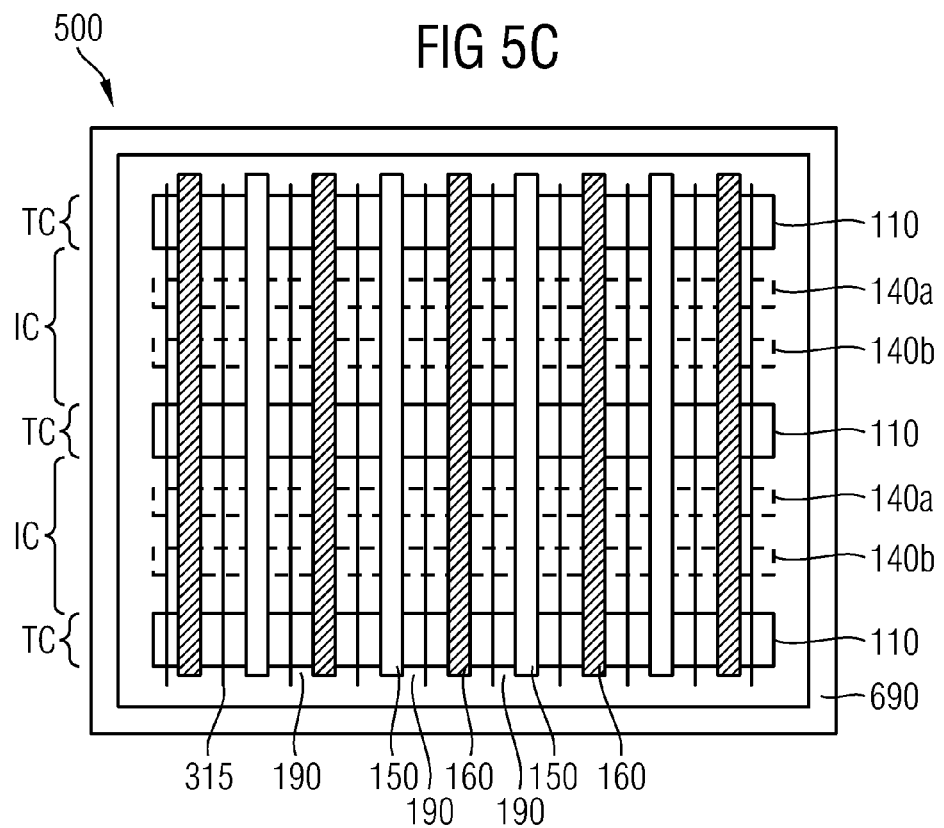
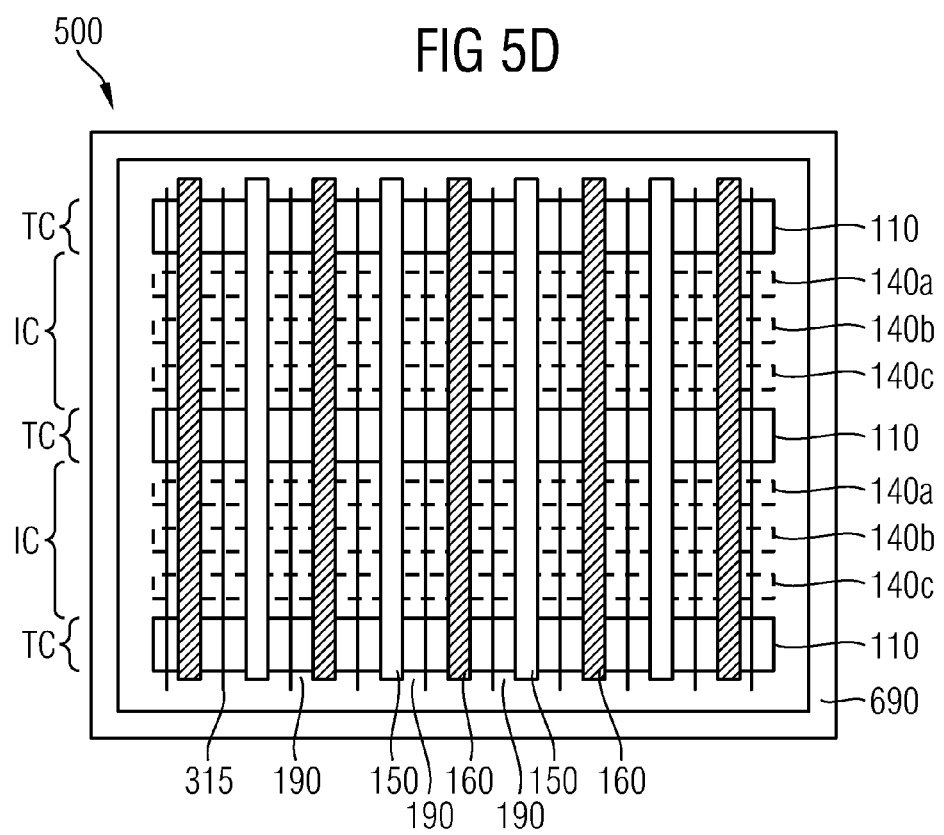

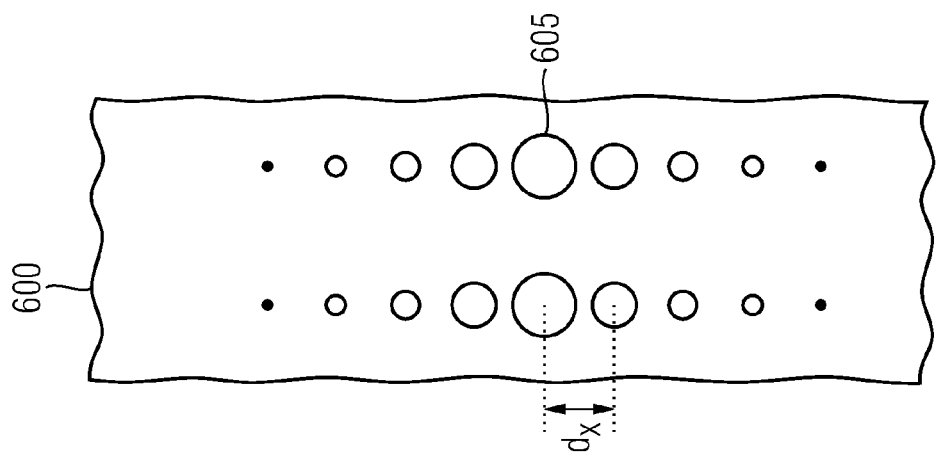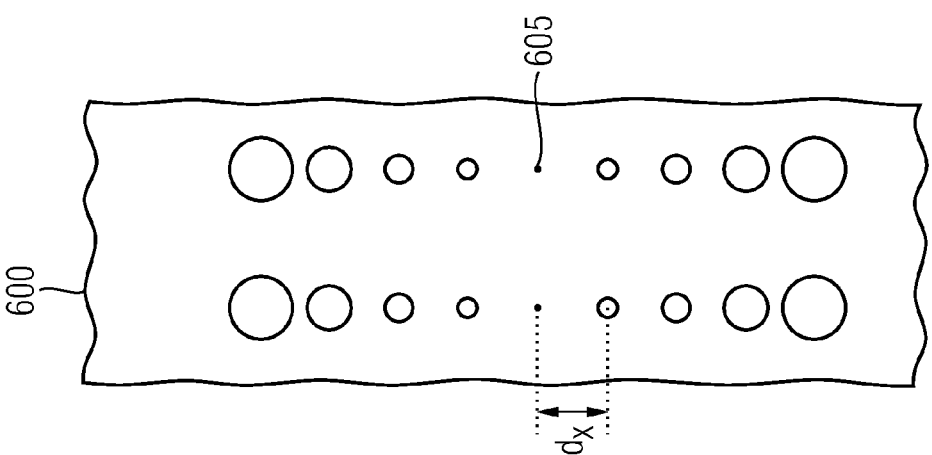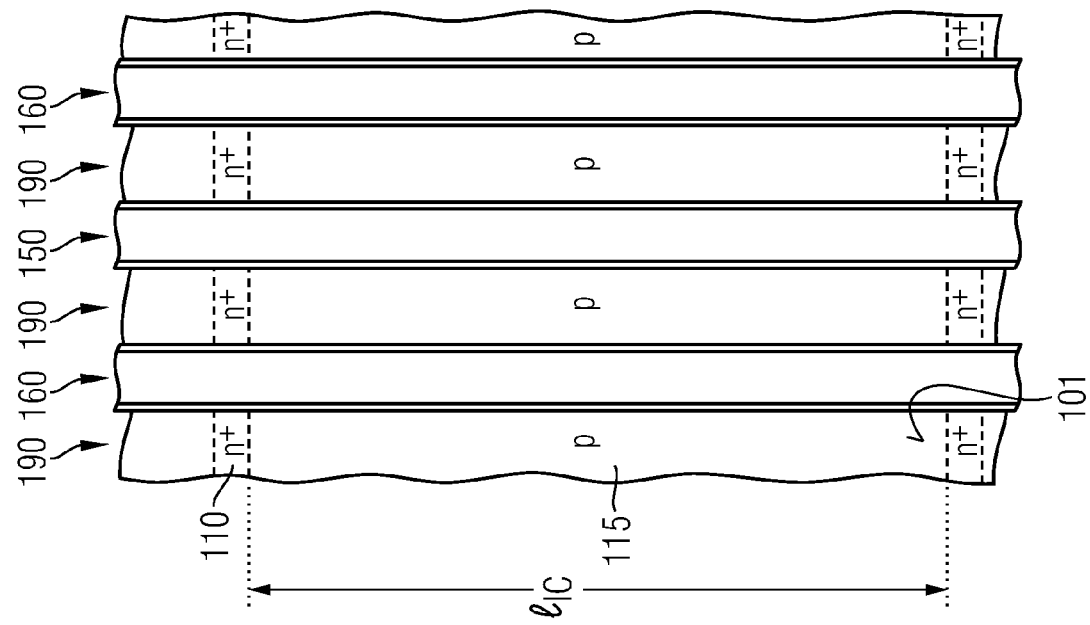

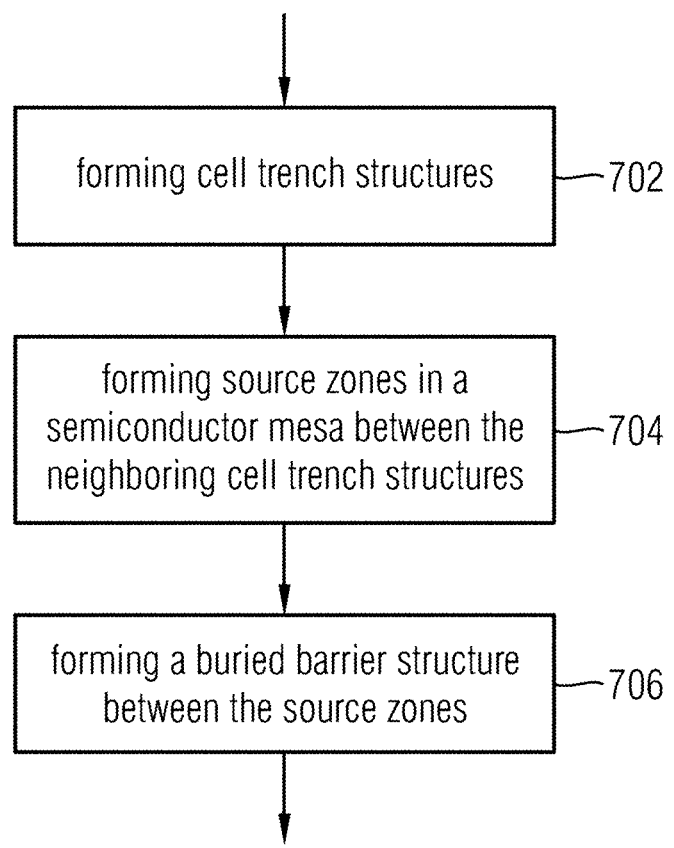

SEMICONDUCTOR DEVICE AND INSULATED GATE BIPOLAR TRANSISTOR WITH BARRIER STRUCTURE

BACKGROUND

In semiconductor diodes and semiconductor switching devices with integrated body diodes like IGFETs (insulated gate field effect transistors) as well as RC-IGBTs (reverse conducting insulated gate bipolar transistors) mobile charge carriers flood the semiconductor regions on both sides of the forward biased pn junction and may form a charge carrier plasma that provides a low forward resistance of the semiconductor diode or body diode but that has to be removed in a reverse recovery period when the pn junction changes from forward biased to reverse biased. The reverse recovery process contributes to the dynamic switching losses of the semiconductor device. A desaturation cycle may attenuate the charge carrier plasma before switching the pn junction from forward biased to reverse biased to reduce the dynamic switching losses. It is desirable to provide semiconductor devices with improved switching characteristics.

SUMMARY

According to an embodiment a semiconductor device includes a semiconductor mesa which is formed between cell trench structures extending from a first surface into a semiconductor body. The semiconductor mesa includes a body zone forming a first pn junction with a drift zone between the body zone and a second surface opposite to the first surface. Source zones are arranged along a longitudinal axis of the semiconductor mesa at a first distance from each other and form second pn junctions with the body zone. A barrier structure forms a unipolar homojunction with the drift zone outside a vertical projection of the source zones perpendicular to the first surface. The barrier structure is absent at least in the vertical projection of the source zones.

According to another embodiment a semiconductor device includes a semiconductor mesa which is formed between cell trench structures that extend from a first surface into a semiconductor body. The semiconductor mesa includes a body zone forming a first pn junction with a drift zone between the body zone and a second surface opposite to the first surface. Source zones are arranged along a longitudinal axis of the semiconductor mesa at a first distance from each other and form second pn junctions with the body zone. A barrier structure separated from the drift zone forms a pn junction with the body zone.

A semiconductor device includes a semiconductor mesa formed between cell trench structures extending from a first surface into a semiconductor body. The semiconductor mesa includes a body zone forming a first pn junction with a drift zone between the body zone and a second surface opposite to the first surface. Source zones are arranged along a longitudinal axis of the semiconductor mesa at a first distance from each other and form second pn junctions with the body zone. A contiguous barrier structure, which has the conductivity type of the source zones, forms a unipolar homojunction with the drift zone in the semiconductor mesa, wherein a net impurity concentration profile of the barrier structure continuously or in steps varies along the longitudinal axis between neighboring source zones by at least 20%.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1C is a schematic cross-sectional view of the semiconductor device portion of FIG. 1A along line C-C.

FIG. 1D is a schematic diagram showing the diode characteristics of the reverse diodes of RC-IGBTs with different barrier structures during desaturation.

FIG. 1E is a schematic lateral cross-sectional view of a portion of a semiconductor device in accordance with an embodiment related to barrier structures buried in a body zone.

FIG. 1F is a schematic lateral cross-sectional view of a portion of a semiconductor device in accordance with an embodiment related to contiguous barrier structures buried in a body zone.

FIG. 2C is a schematic diagram showing the diode characteristics of the reverse diodes of RC-IGBTs with barrier structures including two barrier zones separated by a gap at different gap widths.

FIG. 3C is a schematic planar cross-sectional view of a portion of a semiconductor device in accordance with an embodiment related to a barrier structure between segments of a segmented body zone.

FIG. 3D is a cross-sectional view of the semiconductor device portion of FIG. 3C along line B-B.

FIG. 5A is a schematic plan view of an IGBT in accordance with an embodiment providing narrow continuous barrier structures.

FIG. 5B is a schematic plan view of an IGBT in accordance with an embodiment providing wide continuous barrier structures.

FIG. 5C is a schematic plan view of an IGBT in accordance with an embodiment providing a barrier structure with two barrier zones.

FIG. 5D is a schematic plan view of an IGBT in accordance with an embodiment providing a barrier structure with three barrier zones.

FIG. 6A is a schematic plan cross-sectional view of an IGBT according to a further embodiment.

FIG. 6B is a schematic plan view of an implant mask for providing a barrier structure of the IGBT of FIG. 6A.

FIG. 6C is a schematic plan view of an implant mask for providing another barrier structure.

FIG. 7 is a schematic flow chart for illustrating a method of manufacturing a semiconductor device according to a further embodiment.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
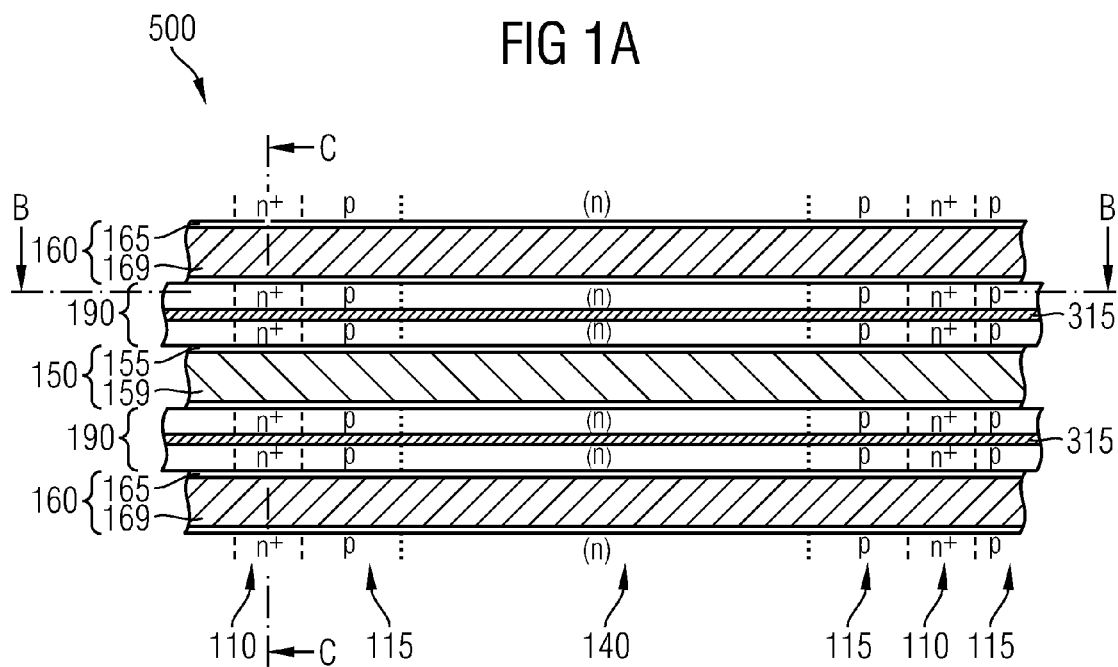
FIG. 1A is a schematic lateral cross-sectional view of a portion of a semiconductor device in accordance with an embodiment related to barrier structures buried in a drift zone.
Figure 1B:
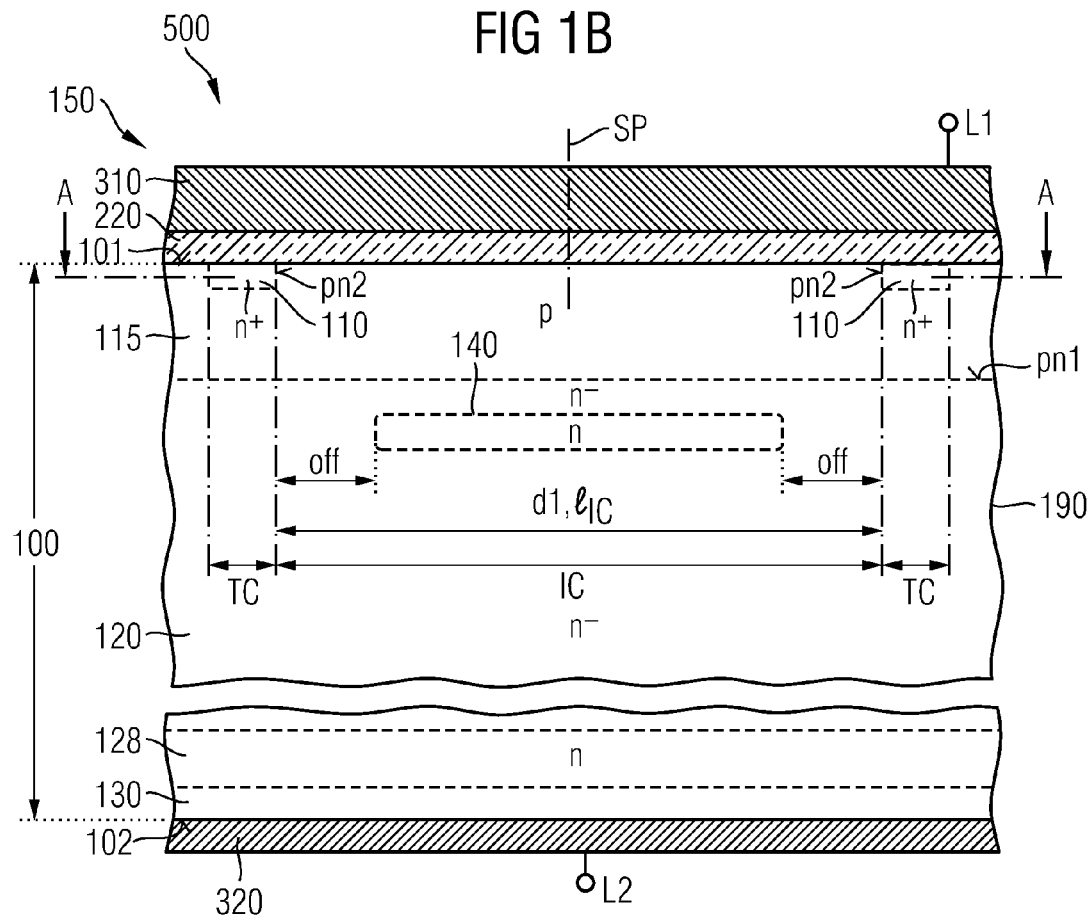
FIG. 1B is a schematic cross-sectional view of the semiconductor device portion of FIG. 1A along line B-B.

FIGS. 1A to 1C illustrate a portion of a semiconductor device 500 including a barrier structure 140 buried in a drift zone 120.

The semiconductor device 500 may be a semiconductor diode, for example an MCD (MOSFET controlled diode), an IGFET (insulated gate field effect transistor) with integrated body diode, for example an MOSFET (metal oxide semiconductor field effect transistor) in the usual meaning including FETs with and without metal gate, an IGBT (insulated gate bipolar transistor), for example an RC-IGBT (reverse conducting IGBT). A semiconductor body 100 of the semiconductor device 500 is provided from a single crystalline semiconductor material, for example silicon (Si), silicon carbide (SiC), germanium (Ge), a silicon germanium crystal (SiGe), gallium nitride (GaN) or gallium arsenide (GaAs) by way of example.

The semiconductor body 100 has a first surface 101, which may be approximately planar or which may be defined by a plane spanned by coplanar surface sections, as well as a mainly planar second surface 102 parallel to the first surface 101. A minimum distance between the first and second surfaces 101, 102 depends on the voltage blocking capability specified for the semiconductor device 500. For example, the distance between the first and second surfaces 101, 102 may be 90 μm to 120 μm for an IGBT specified for a blocking voltage of about 1200 V. Other embodiments related to IGBTs with high blocking capabilities may provide semiconductor bodies 100 with a thickness of several 100 μm.

In a plane parallel to the first surface 101 the semiconductor body 100 may have a rectangular shape with an edge length in the range of several millimeters. A normal to the first surface 101 defines a vertical direction and directions orthogonal to the vertical direction are lateral directions.

The semiconductor body 100 includes a drift zone 120 of a first conductivity type, a contiguous or segmented body zone 115 of a second conductivity type, which is opposite to the first conductivity type, between the first surface 101 and the drift zone 120 as well as a pedestal layer 130 between the drift zone 120 and the second surface 102.

For the illustrated embodiments the first conductivity type is the n-type and the second conductivity type is the p-type. Similar considerations as outlined below apply to embodiments with the first conductivity type being the p-type and the second conductivity type being the n-type.

An impurity concentration in the drift zone 120 may gradually or in steps increase or decrease with increasing distance to the first surface 101 at least in portions of its vertical extension. According to other embodiments the impurity concentration in the drift zone 120 may be approximately uniform. For IGBTs based on silicon, a mean impurity concentration in the drift zone 120 may be between $5 \times 10^{12}$ (5E12) cm$^{-3}$ and $1 \times 10^{15}$ (1E15) cm$^{-3}$, for example in a range from $1 \times 10^{13}$ (1E13) cm$^{-3}$ to $1 \times 10^{14}$ (1E14) cm$^{-3}$. In the case of a semiconductor device based on SiC, a mean impurity concentration in the drift zone 120 may be between $5 \times 10^{14}$ (5E14) cm$^{-3}$ and $1 \times 10^{17}$ (1E17) cm$^{-3}$, for example in a range from $1 \times 10^{15}$ (1E15) cm$^{-3}$ to $1 \times 10^{16}$ (1E16) cm$^{-3}$.

The pedestal layer 130 may have the first conductivity type in case the semiconductor device 500 is a semiconductor diode or a MOSFET, or may have the second conductivity type in case the semiconductor device 500 is an IGFET, or may include zones of both conductivity types extending between the drift zone 120 and the second surface 102 in case the semiconductor device 500 is an RC-IGBT. A mean impurity concentration for p-type zones of the pedestal layer 130 may be at least $1 \times 10^{16}$ (1E16) cm$^{-3}$, for example at least $5 \times 10^{17}$ (5E17) cm$^{-3}$.

A field stop layer 128 of the first conductivity type may separate the pedestal layer 130 from the drift zone 120, wherein a mean net impurity concentration in the field stop layer 128 may be lower than the impurity concentration in the pedestal layer 130 by at least one order of magnitude and may be higher than in the drift zone 120 by at least one order of magnitude.

Cell trench structures 150, 160 extend from the first surface 101 into the drift zone 120. Portions of the semiconductor body 100 between neighboring cell trench structures 150, 160 form semiconductor mesas 190.

The cell trench structures 150, 160 may be stripes extending along a first lateral direction given by the longitudinal axes of the semiconductor mesas 190. The semiconductor mesas 190 may be regularly arranged at a uniform pitch (center-to-center distance) of, for example, 400 nm to 20 µm, for example 800 nm to 2 µm.

For IGFETs and IGBTs, active cell trench structures 150 may include a gate electrode 159 and a gate dielectric 155 separating the gate electrode 159 from the semiconductor body 100. The gate electrode 159 may be a homogenous structure or may have a layered structure including one or more conductive layers. According to an embodiment the gate electrode 159 may include or consist of heavily doped polycrystalline silicon.

The gate dielectric 155 may include or consist of a semiconductor oxide, for example thermally grown or deposited silicon oxide, a semiconductor nitride, for example deposited or thermally grown silicon nitride, or a semiconductor oxynitride, for example silicon oxynitride.

Passive cell trench structures 160 may include a field electrode 169 and a field dielectric 165 separating the field electrode 169 from the semiconductor body 100. The field electrode 169 may be a homogenous structure or may have a layered structure including one or more conductive layers. According to an embodiment, the field electrode 169 may include or consist of a heavily doped polycrystalline silicon layer. The field electrode 169 and the gate electrode 159 may have the same configuration and may include the same materials.

The field dielectric 165 may include or consist of a semiconductor oxide, for example thermally grown or deposited silicon oxide, a semiconductor nitride, for example deposited or thermally grown silicon nitride, or a semiconductor oxynitride, for example silicon oxynitride.

The field and gate dielectrics 155, 165 may have the same configuration and/or may include the same materials.

Active and passive cell trench structures 150, 160 may alternate in a regular fashion. For example, one single passive cell trench structure 160 may be arranged between each pair of active cell trench structures 150. According to other embodiments, two, three or more passive cell trench structures 160 may be arranged between each pair of active cell trench structures 150.

For semiconductor diodes like MCDs one single type of cell trench structures may include control electrodes for controlling a desaturation mode, wherein the control electrode is electrically coupled or connected to a desaturation terminal of the semiconductor diode.

For IGFETs and IGBTs the gate electrodes 159 may be electrically connected to a gate terminal G of the semiconductor device 500. The field electrodes 165 may be electrically connected to an auxiliary terminal of the semiconductor device 500 or may be electrically connected with one of the load electrodes of the semiconductor device 500. For example, the field electrode 165 may be electrically connected or coupled to the anode electrode of a semiconductor diode, to the source electrode of an IGFET, or to the emitter electrode of an IGBT.

A distance between the first surface 101 and a bottom of the cell trench structures 150, 160 may range from 1 µm to 30 µm, e.g., from 3 µm to 7 µm. A lateral width of the semiconductor mesas 190 may range from 0.05 µm to 10 µm, e.g., from 0.15 µm to 1 µm.

The body zones 115 are formed in first sections of the semiconductor mesas 190 oriented to the first surface 101 and may directly adjoin to the first surface 101 in sections of each semiconductor mesa 190. A mean net impurity concentration in the body zones 115 may be in the range from $1 \times 10^{16}$ (1E16) cm$^{-3}$ to $5 \times 10^{18}$ (5E18) cm$^{-3}$, for example between $1 \times 10^{17}$ (1E17) cm$^{-3}$ and $5 \times 10^{17}$ (5E17) cm$^{-3}$. Each body zone 115 forms a first pn junction pn1 with the drift zone 120. A semiconductor mesa 190 may include one contiguous body zone 115 as illustrated or a segmented body zone 115 whose segments may be separated by portions of the drift zone 120 adjoining the first surface 101.

For semiconductor diodes, the body zones 115 are effective as the anode. For MCDs, IGFETs and IGBTs such as RC-IGBTs, the semiconductor mesas 190 adjoining to at least one active cell trench structure 150 may further include source zones 110 forming second pn junctions pn2 with the body zone 115, whereas semiconductor mesas 190 between passive cell trench structures 160 may be or may not be devoid of source zones 110. The source zones 110 may be formed as wells extending from the first surface 101 into the body zone 115 and define transistor cells TC arranged at a first distance dl along the longitudinal axis of the respective semiconductor mesa 190. For MCDs, the transistor cells TC are effective as desaturation cells.

Injection cells IC separate neighboring transistor cells TC assigned to the same semiconductor mesa 190, wherein in the injection cells IC the body zone 115 of the semiconductor mesa 190 directly adjoins the first surface 101. Transistor cells TC and injection cells IC alternate along the longitudinal axis of the respective semiconductor mesa 190.

The first distance dl gives the injection cell length $l_{IC}$ and may be in a range from 10 µm to 200 µm, for example in a range from 50 µm to 100 µm.

A dielectric structure 220 separates a first load electrode 310 from the first surface 101. The dielectric structure 220 may include one or more dielectric layers from silicon oxide, silicon nitride, silicon oxynitride, doped or undoped silicon glass, for example BSG (boron silicate glass), PSG (phosphorus silicate glass), or BPSG (boron phosphorus silicate glass), by way of example.

The first load electrode 310 may be an anode electrode in case the semiconductor device 500 is a semiconductor diode, a source electrode in case the semiconductor device 500 is an IGFET, or an emitter electrode in case the semiconductor device 500 is an IGBT.

Contact structures 315 extend through the dielectric structure 220 and may extend into the semiconductor body 100. The contact structures 315 electrically connect the first load electrode 310 with the source zones 110 and the body zones 115. According to embodiments related, e.g., to non RC-IGBTs for each semiconductor mesa 190 a plurality of separated contact structures 315 may be in substance aligned with the source zones 110. Other embodiments related to, e.g., RC-IGBTs may provide stripe-shaped contact structures 315 extending along a first lateral direction given by the longitudinal axis of the concerned semiconductor mesa 190.

The first load electrode 310 may be or may be electrically coupled or connected to a first load terminal L1 which may be the anode terminal of a semiconductor diode, the source terminal of an IGFET or the emitter terminal of an IGBT.

A second load electrode 320 directly adjoins the second surface 102 and the pedestal layer 130. The second load electrode 320 may be or may be electrically connected to a second load terminal L2, which may be the cathode terminal of a semiconductor diode, the drain terminal of an IGFET or the collector terminal of an IGBT.

Each of the first and second load electrodes 310, 320 may consist of or contain, as main constituent(s) aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), titanium (Ti), tungsten (W), tantalum (Ta), silver (Ag), gold (Au), platinum (Pt), and/or palladium (Pd). For example, at least one of the first and second load electrodes 310, 320 may include two or more sub-layers, wherein each sub-layer contains one or more of Ni, Ti, Ag, Au, Pt, W, and Pd as main constituent(s), e.g., a silicide, a nitride and/or an alloy.

A barrier structure 140 is formed between the body zone 115 and the second surface 102 in a portion of the semiconductor mesa 190 outside the vertical projection of neighboring source zones 110 in at least some of the injection cells IC or in each injection cell IC. The barrier structure 140 forms a unipolar homojunction, e.g., an nn$^-$, nn$^+$, pp$^-$, or pp$^+$ junction with the drift zone 120. A mean impurity concentration in the barrier structure 140 is at least ten times as high as a mean impurity concentration in the drift zone 120. According to an embodiment, the mean impurity concentration in the barrier structure 140 may range from $1\times10^{16}$ (1E16) cm$^{-3}$ to $1\times10^{18}$ (1E18) cm$^{-3}$, for example from $1\times10^{17}$ (1E17) cm$^{-3}$ to $5\times10^{17}$ (5E17) cm$^{-3}$. The impurities (dopants) may be phosphorus (P), arsenic (As), and/or deep level donors or deep double donors like selenium (Se) and/or sulfur (S) atoms/ions.

The barrier structure 140 is absent in the transistor cells TC, i.e., in the vertical projection of the source zones 110 perpendicular to the first surface 101. Along the first lateral direction, the barrier structure 140 may have an offset off to the source zones 110 that is at least 2% of the injection cell length $l_{IC}$, for example at least 5% or 20%. According to an embodiment the offset off is at least 0.5 µm, for example at least 1 µm or 5 µm. The barrier structure 140 may be formed along at most 95% of the injection cell length $l_{IC}$, e.g., at most 50% or at most 30% and may be symmetric with respect to a vertical symmetry plane SP of the concerned injection cell IC at the half distance between neighboring source zones 110.

The buried structure 140 may be completely buried in the drift zone 120 at a distance to the first pn junction pn1. According to other embodiments, the buried structure 140 may extend from the first pn junction pn1 into the drift zone 120 or may extend both into the drift zone 120 and into the body zone 115. In the illustrated embodiment the barrier structure 140 may be one continuous structure that extends over at least 30 percent of the injection cell length $l_{IC}$.

According to other embodiments the barrier structure 140 may include two or more spatially separated barrier zones at distances from 0.5 to 30 µm, by way of example.

In a reverse conduction mode of an IGBT or IGFET or in a forward mode of a semiconductor diode, the first pn junction pn1 forming the body diode is forward biased and the injection cells IC inject holes into the drift zone 120. At the same time the pedestal layer 130 injects electrons into the drift zone 120. The resulting high density charge carrier plasma ensures a low forward resistance of the body diode and low static losses of the semiconductor device. In a reverse recovery period, the charge carrier plasma is removed from the drift zone 120 before the body diode is reverse biased, wherein the dynamic switching losses increase with the amount of recovered charge. Equivalent considerations apply to the reverse diode in RC-IGBTs.

A desaturation cycle may reduce the charge carrier plasma before the first pn junction pn1 changes from forward biased to reverse biased in order to reduce the switching losses. During a desaturation period, in each transistor cell TC a gate signal applied to the gate electrodes 155 or, in case of semiconductor diodes, to the control electrodes, induces an inversion channel between the source zone 110 and the drift zone 120 through the body zone 115. Each inversion channel bypasses sections of the first pn junctions pn1 assigned to the transistor cells TC such that the transistor cells TC do not inject holes into the drift zone 120 during the desaturation period. At the first pn junction pn1 a lateral voltage drop along the semiconductor mesa 190 may sufficiently forward-bias a central portion of the injection cell IC to inject holes into the drift zone 120 even during the desaturation period. As a result, the desaturation cycle reduces the charge plasma density in the drift zone 120 and at the same time provides sufficient charge carriers for maintaining a current flow through the body diode.

The barrier structure 140 in this way fine-tunes the remaining hole emitter efficiency of the injection cells IC which must be sufficiently high for allowing a sufficiently high load current flow during the desaturation period and which must be sufficiently low to ensure a sufficient efficiency of the desaturation cycle.

Decreasing hole injection by reducing the injection cell length $l_{IC}$ may deteriorate the device parameters. Alternatively, the hole emitter efficiency may be reduced. Hole emitter efficiency is controlled by the total amount of impurities in the body zones 110 and may be lowered by reducing an implant dose for forming the body zone 115. Lowering the impurity concentration in the body zones 115, however, may result in insufficient ohmic contacts to the first load electrode 310 and increases the risk for latch-up effects that may ignite a parasitic thyristor structure in the IGBT mode. Other approaches for lowering the hole emitter efficiency of the body zones 115 reduce the total impurity amount by etching contact recesses from the first surface 101 into the body zones 115. Deep contact recesses, however, complicate the formation of leak-proof diffusion barriers in the contact recesses.

Instead, the barrier structure 140 fine-tunes the hole emitter efficiency in the injection cells IC even at comparatively high impurity concentrations in the body zones 115 and at comparatively shallow and uncritical contact recesses. In addition, the barrier structure 140 does not adversely affect the blocking characteristics of the transistor cells TC and hence the transistor or IGBT characteristics.

FIG. 1D shows diode characteristics of reverse diodes of a conventional RC-IGBT as well as RC-IGBTs based on the semiconductor device of FIGS. 1A to 1C.

The diode characteristic 401 gives a reference example without any barrier structure. Diode characteristic 402 refers to an RC-IGBT with a continuous buried barrier structure 140 extending over 10 percent of the injection cell length $l_{IC}$ symmetrically with respect to symmetry planes in the center of the injection cells IC and missing in the transistor cells TC. The impact of the barrier structure 140 is comparatively low. Diode characteristic 403 refers to an RC-IGBT with a contiguous symmetric barrier structure 140 extending over 30 percent of the injection cell length $l_{IC}$. The increased voltage drop at the same reverse current $I_{RC}$ indicates a significant reduction of the plasma density and hence significantly reduced hole emitter efficiency directly correlated to the dynamic losses of the respective IGBT.

In FIG. 1E the barrier structure 140 is completely buried in the body zone 115 in portions of the body zone 115 outside the vertical projection of the source zones 110. The barrier structure 140 forms a third pn junction pn3 with the body zone 115. A thin portion of the p-type body zone 115 separates the barrier structure 140 from the drift zone 120. As regards placement and pattern along the longitudinal axis, as well as the impurity concentration in the barrier structure 140, reference is made to the barrier structures of FIGS. 1A, 2A and 3A.

The barrier structure 140 of FIG. 1F is a contiguous structure including first portions outside a vertical projection of the source zones 110 and second portions in the vertical projection of the source zones 110, wherein the first and second portions are connected to each other. The contiguous barrier structure 140 may extend along the complete longitudinal extension of the respective semiconductor mesa 190. In the on-state of the semiconductor device 500 an inversion channel includes two separated portions on different sides of the barrier structure 140.

Within the contiguous barrier structure 140 the impurity concentration may be uniform or may vary along the longitudinal axis of the semiconductor mesa 190. For example, a maximum impurity concentration in the barrier structure 140 may be at least 20%, for example at least 50%, higher than a minimum impurity concentration along the longitudinal axis. According to an embodiment the maximum impurity concentration in the barrier structure 140 is at least ten times as high as the minimum impurity concentration along the longitudinal axis.

In embodiments referring to semiconductor diodes and RC-IGBTs, the impurity concentration in portions of the barrier layer 140 in and close to the transistor cells TC may be higher than in portions in the centers of the injection cells IC. In embodiments concerning non-reverse-conducting IGBTs, the impurity concentration in portions of the barrier layer 140 in and close to the transistor cells TC may be lower than in portions in the centers of the injection cells IC.

Figure 2A:
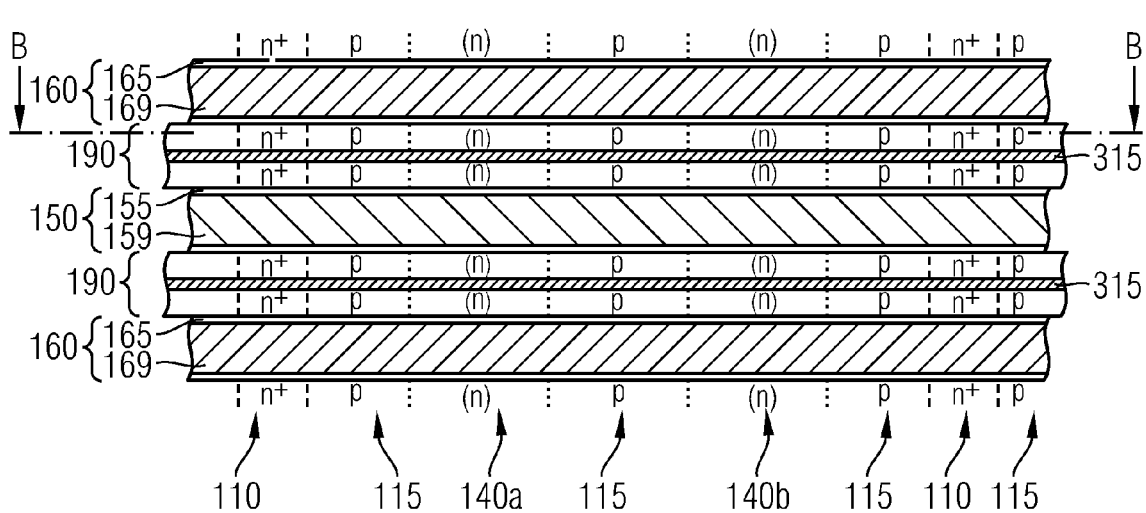
FIG. 2A is a schematic planar cross-sectional view of a portion of a semiconductor device in accordance with an embodiment providing a barrier structure extending into a drift zone.
Figure 2B:
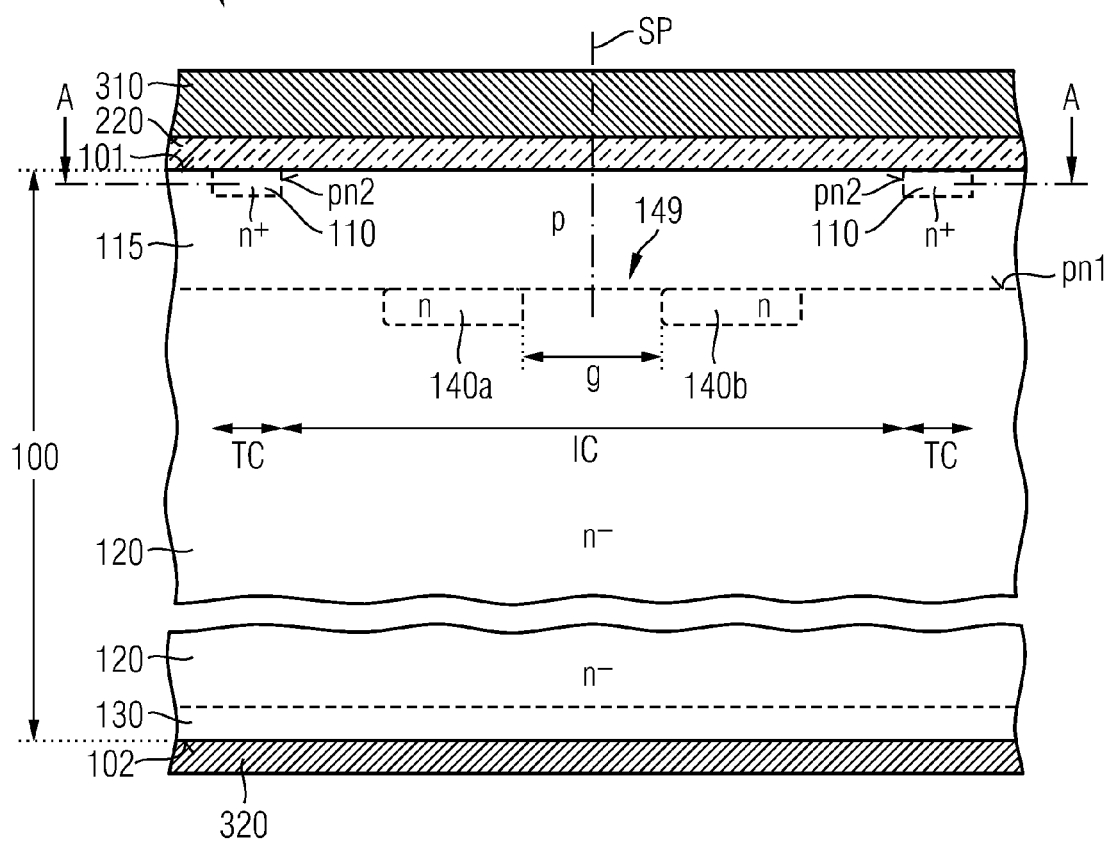
FIG. 2B is a cross-sectional view of the semiconductor device portion of FIG. 2A along line B-B.

FIGS. 2A to 2B refer to semiconductor devices 500 which distinguish form the semiconductor device 500 of FIGS. 1A to 1C in that a gap g separates two barrier zones 140a, 140b of a barrier structure 140 which extends from the first pn junction pn1 into the drift zone 120.

During the desaturation period of the semiconductor device 500 a voltage applied to the gate electrode 159 generates an electric field which accumulates minority charge carriers in inversion channels in portions of the body zone 115 between the source zones 110 and the drift zone 120 along the active cell trench structures 150. The inversion channels form paths for the minority charge carriers through the body zone 115, i.e., electrons for p-type body zones 115 and holes for n-type body zones 115.

When after the desaturation period the first pn junction pn1 between the body zone 115 and the drift zone 120 changes from forward biased to reverse biased less charge carriers contribute to the reverse recovery losses than without desaturation cycle.

During the desaturation cycle, the portions of the first pn junction pn1 in the vertical projection of the source zones 110 are by-passed such that in the transistor cells TC no holes are injected from the body zones 115 into the drift zones 120. With increasing distance to the source zones 110 along the longitudinal axis of the semiconductor mesa 190 the first pn junction pn1 gets increasingly forward-biased such that at a sufficient distance to the source zones 110 the body zone 115 injects holes into the drift zone 120 to maintain a sufficient diode current flow even during the desaturation period.

A contiguous barrier structure 140 as illustrated in FIGS. 1A to 1C increases conductivity along the longitudinal axis of the semiconductor mesa 190 such that a sufficient forward-bias at the first pn junction pn1 occurs only at a comparatively large distance to the source zones 110. If the injection cells IC are comparatively short, injection only takes place in a section between the transistor cells TC and the barrier structure 140, wherein injection starts only at a comparatively high reverse current $I_{RC}$ that results in a significant snap-back effect with a comparatively high snap-back voltage between the load electrodes as illustrated by the diode characteristic 403 in FIG. 1D.

Segmenting the barrier structure 140 along the longitudinal axis of the semiconductor mesas 190 with gaps g between two or more barrier zones 140a, 140b as illustrated in FIGS. 2A to 2B significantly reduces the snap-back voltage while still significantly reducing charge carrier plasma density during the desaturation period.

Referring again to FIG. 1D, diode characteristic 404 refers to a total barrier length of 20% of the injection cell length and a gap g of about 10% of the injection cell length $l_{IC}$. Compared to diode characteristic 403 referring to a contiguous barrier structure 140 with a length of 30% of the injection cell length $l_{IC}$, the smaller total barrier length increases hole emitter efficiency whereas the snap-back voltage is significantly reduced.

FIG. 2C refers to the reverse conducting characteristics of RC-IGBTs based on the semiconductor device 500 of FIGS. 2A to 2B with different extensions of the gap g between the two barrier zones 140a, 140b.

In each RC-IGBT the barrier structure 140 includes two barrier zones 140a, 140b extending in total over 20% of the injection cell length $l_{IC}$. The diode characteristic 411 gives a reference example without any gap, diode characteristic 412 refers to barrier zones 140a, 140b with a symmetric gap extending over 10% of the injection cell length $l_{IC}$, diode characteristic 413 refers to a symmetric gap extending over 20% of the injection cell length $l_{IC}$ and diode characteristic 414 to a barrier structure 140 with a symmetric gap extending over 30% of the injection cell length $l_{IC}$. Since the total length of the barrier structure 140 is the same for all embodiments, the snap-back voltage is approximately the same. For gaps with 10% and 20% of the injection cell length $l_{IC}$, the increased voltages for the same diode current $I_{RC}$ indicate a significantly reduced charge carrier plasma density.

Varying the gap size between the barrier zones 140a, 140b effects that for the same snap-back voltage the hole emitter efficiency can be further fine-tuned. The gap width can be used to precisely trim the hole emitter efficiency within the desaturation period in the reverse conducting mode. The gap width along the longitudinal axes may be in a range from 5% to 40%, e.g., 5% to 20% of the first distance d1. For example, a minimum gap width may be 0.5 µm.

Embodiments with two, three or more passive cell trench structures 160 arranged between each pair of active cell trench structures 150 may provide auxiliary semiconductor mesas 190 between passive cell trench structures 160, wherein the auxiliary semiconductor mesas 190 may be without electrical connection with any of the load electrodes 310, 320. According to an embodiment, some or all of the auxiliary semiconductor mesas 190 are electrically connected to the first load electrode 310 and are effective as diode mesas used exclusively in the reverse conducting mode. Other diode mesas may be semiconductor mesas 190 without source zones 110.

The diode mesas may locally override the snap-back effect induced by the barrier structures 140 in the semiconductor mesas 190 with transistor cells TC. The diode mesas may include or may not include barrier structures 140, wherein the diode mesas may include contiguous barrier structures 140 or segmented barrier structures or wherein some diode mesas include contiguous barrier structures 140 and other diode mesas include segmented barrier structures 140.

Figure 3A:
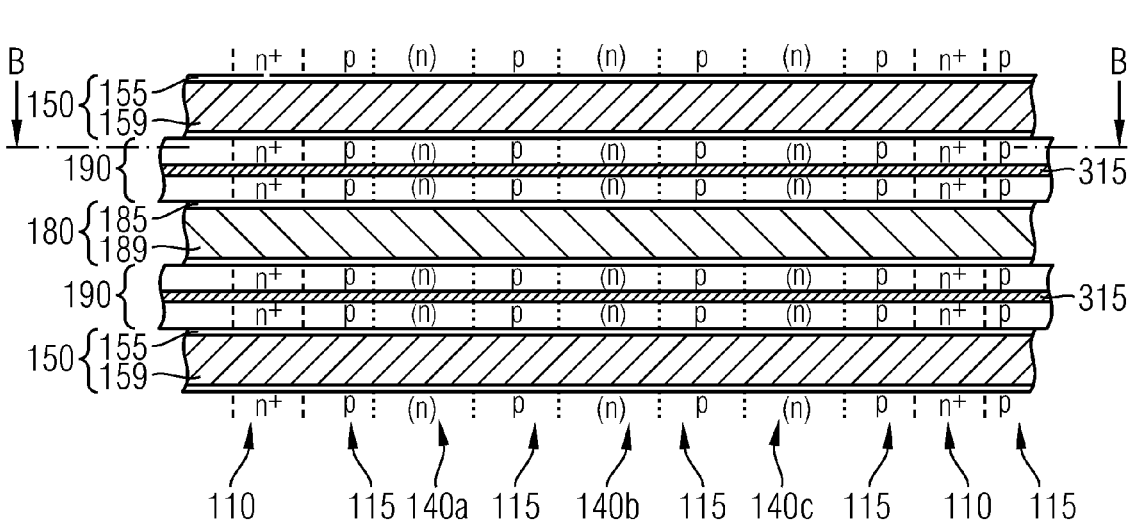
FIG. 3A is a schematic planar cross-sectional view of a portion of a semiconductor device in accordance with an embodiment related to a barrier structure along a pn junction between body and drift zones.
Figure 3B:
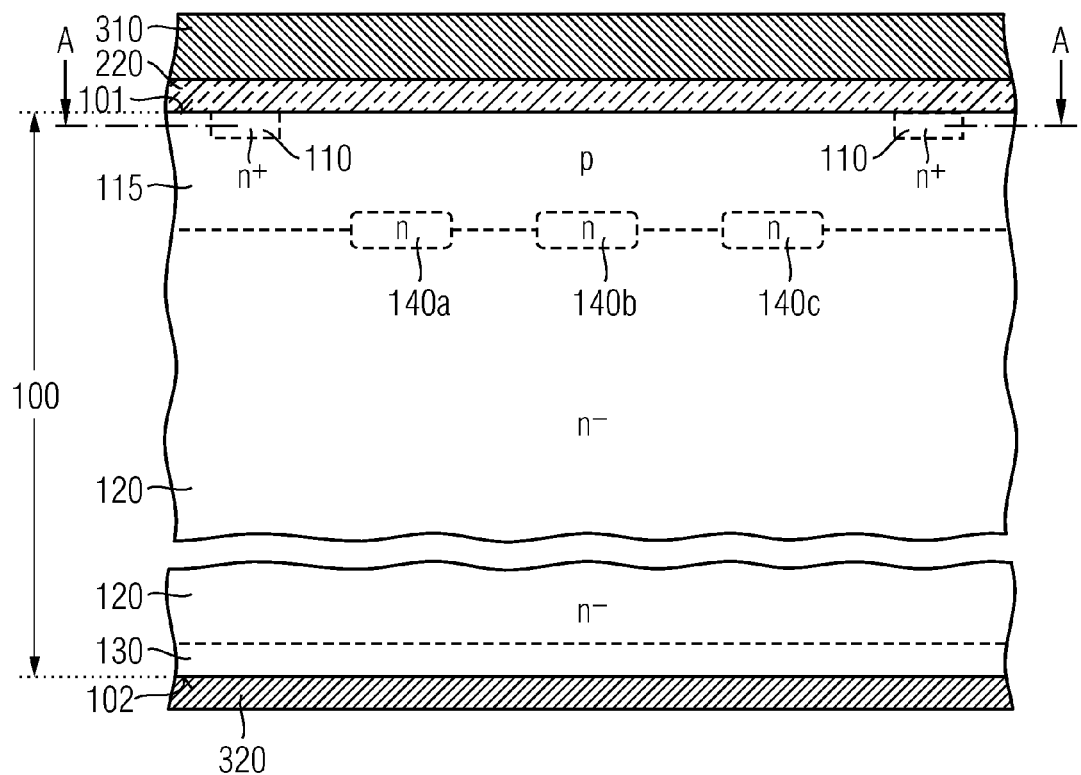
FIG. 3B is a cross-sectional view of the semiconductor device portion of FIG. 3A along line B-B.

The semiconductor device 500 illustrated in FIGS. 3A to 3B includes three separated barrier zones 140a, 140b, 140c extending from a plane defined by the first pn junction pn1 into both the body zone 115 and the drift zone 120. The barrier zones 140a, 140b, 140c form pn junctions with the body zone 115 and unipolar homojunctions with the drift zone 120.

Figure 3E:
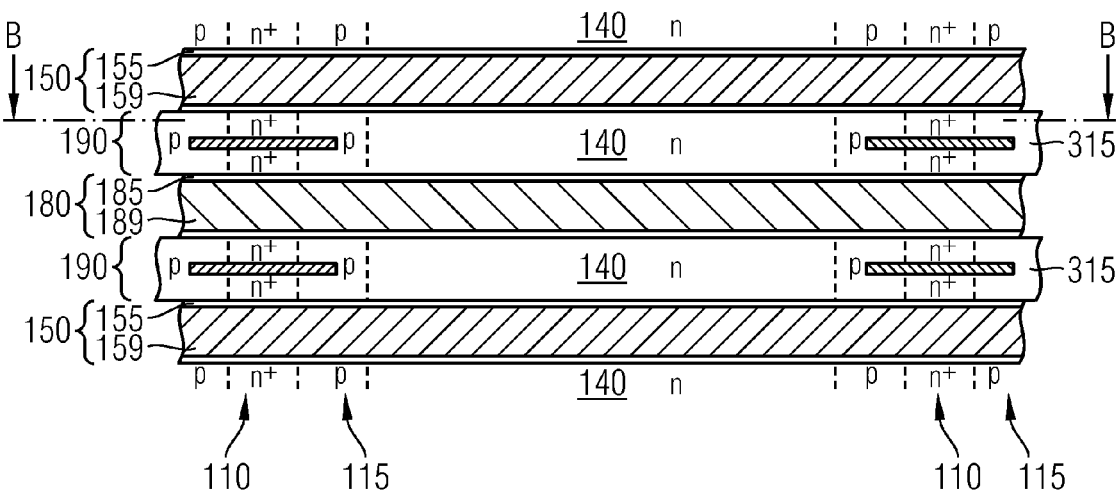
FIG. 3E is a schematic planar cross-sectional view of a portion of a semiconductor device in accordance with an embodiment related to a barrier structure separating segments of a segmented body zone.
Figure 3F:
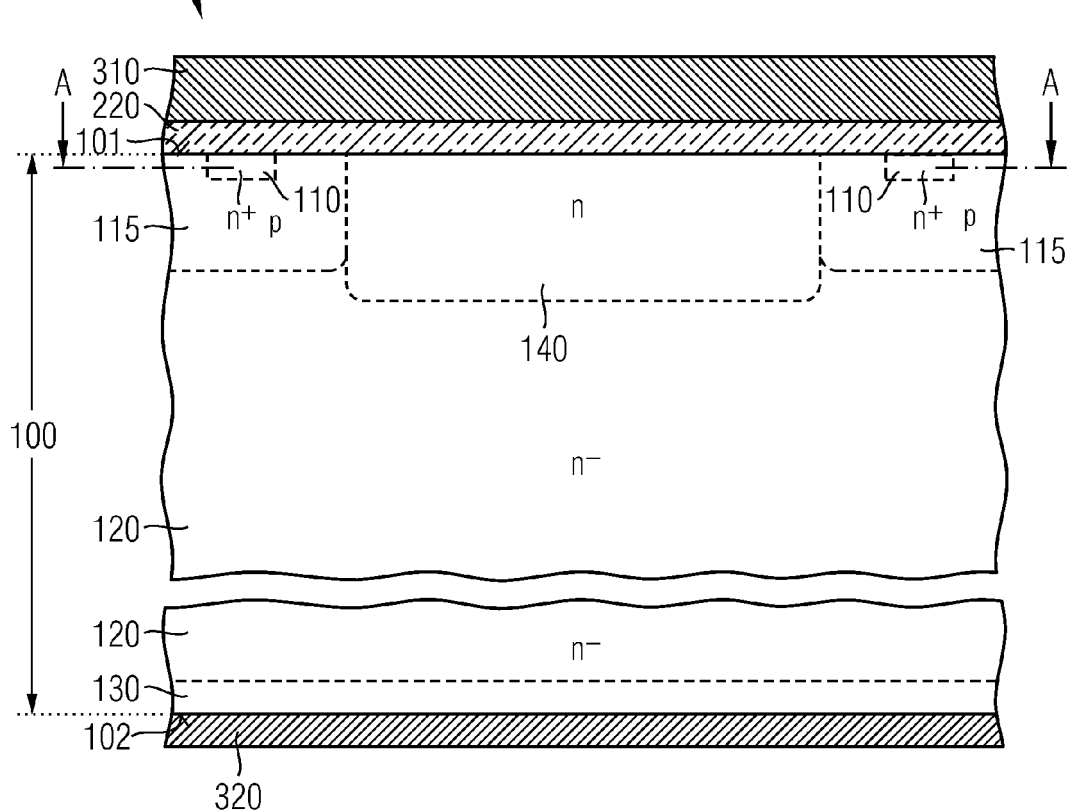
FIG. 3F is a cross-sectional view of the semiconductor device portion of FIG. 3E along line B-B.

FIGS. 3C and 3D refer to an embodiment with a segmented body zone 115. Regions 125 of the conductivity type of the source zones 110 may directly adjoin the first surface 101 between segments of the body zone 115. A barrier structure 140 between the regions 125 and the drift zone 120 forms a unipolar homojunction with the drift zone 120 outside the vertical projection of the source zones 110. The barrier structure 140 may be laterally spaced from the neighboring segments of the body zone 115 or from the vertical projection of the segments of the body zone 115. According to the illustrated embodiment the barrier structure 140 weakly laterally overlaps the vertical projection of the segments of the body zone 115. A distance between the barrier structure 140 and the first surface 101 may be smaller, equal or greater than a vertical extension of the segments of the body zone 115. The barrier structure 140 may include two, three or more spatially separated barriers zones In FIGS. 3E and 3F the barrier structure 140 separates the segments of a segmented body zone 115 and is in touch with the first surface 101. The barrier structure 140 may include two, three or more barrier zones. A vertical extension of the barrier structure 140 may be smaller than, equal to or greater than a vertical extension of the body zones 115.

FIGS. 4A to 4D show the reverse current distribution in the semiconductor body 100 of RC-IGBTs 501 at a given reverse current for different configurations of a barrier structure 140 extending with a total length of 20% of the injection cell length $l_{IC}$.

Figure 4A:
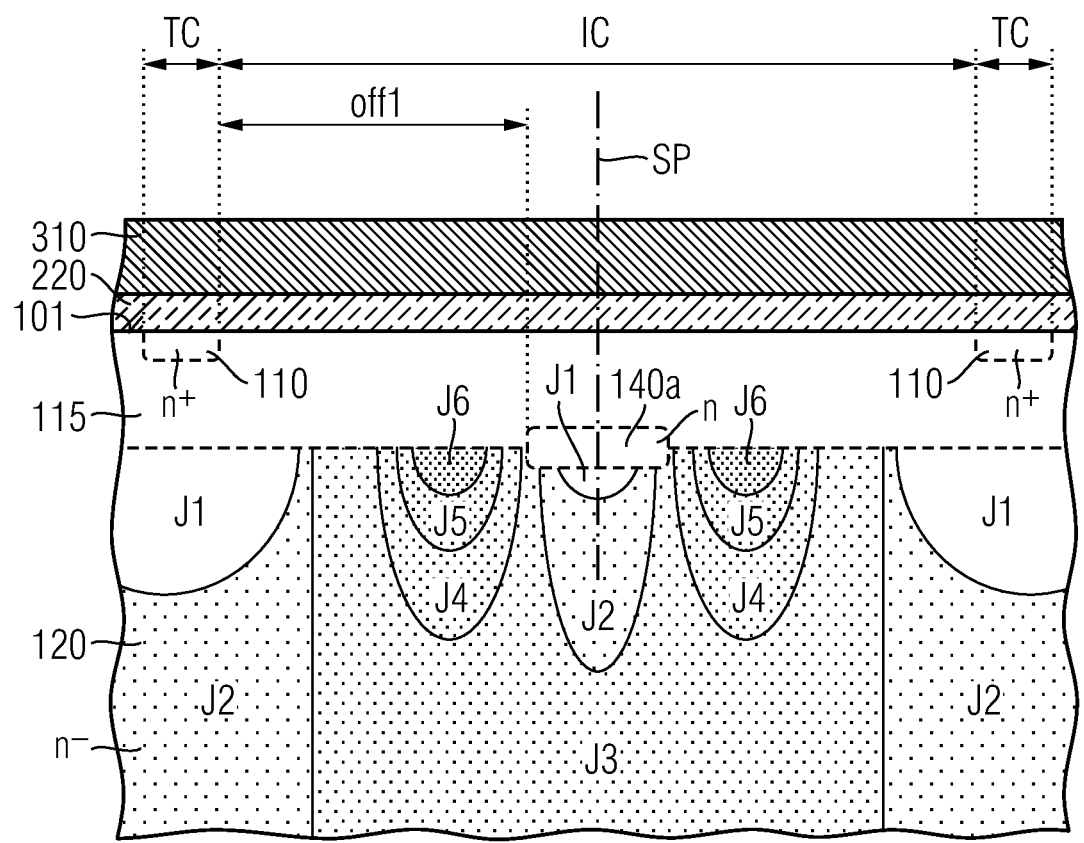
FIG. 4A is a schematic cross-sectional view showing a current density distribution in a semiconductor body of a semiconductor device including a barrier structure with a single barrier zone.

FIG. 4A refers to an injection cell IC with a contiguous barrier structure 140 extending over 20% of the injection cell length $l_{IC}$ in the center of the injection cell IC. The barrier structure 140 has a first offset off1 to the transistor cell TC and suppresses the injection of holes such that carrier density is low in the vertical projection of the barrier structure 140. A section of the semiconductor mesa 190 between the transistor cell TC and the injection cell IC injects holes only when a current is sufficiently high to generate a sufficient lateral voltage drop. The snap-back voltage is high and the charge carrier plasma density at high currents is low.

Figure 4B:
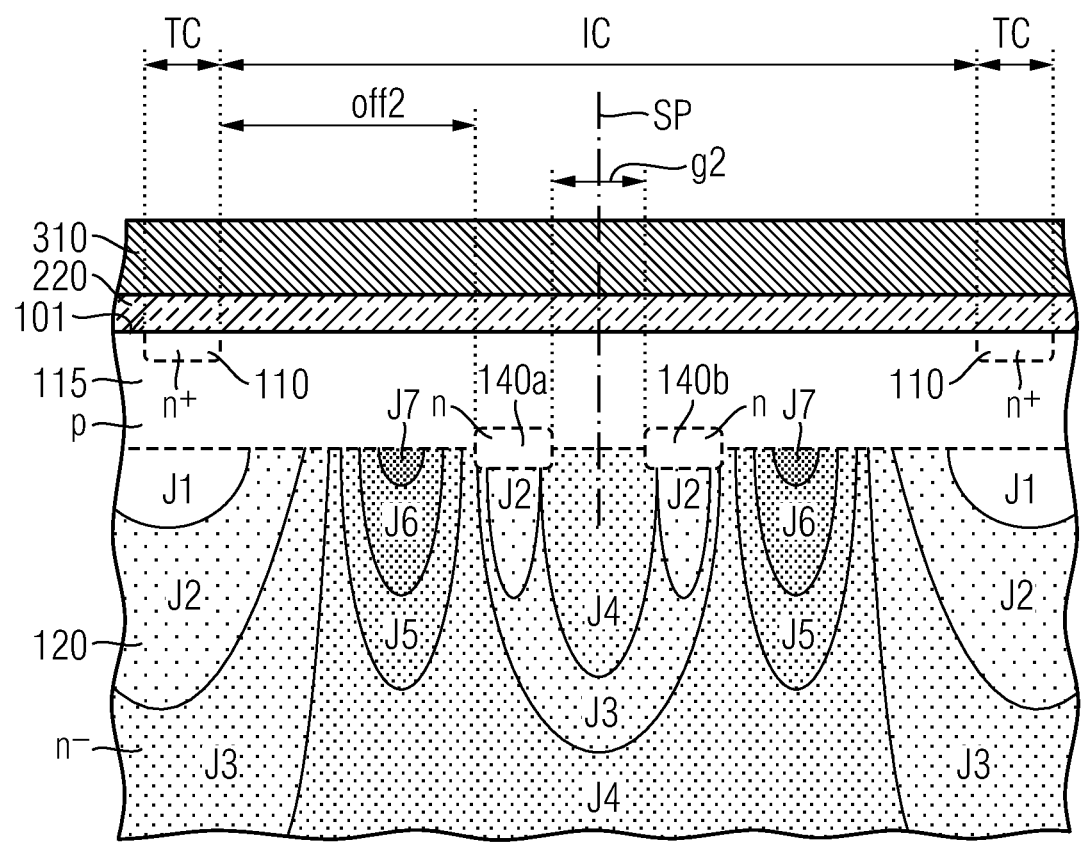
FIG. 4B is a schematic cross-sectional view showing a current density distribution in a semiconductor body of a semiconductor device including a barrier structure with two barrier zones and a gap between the barrier zones extending over 10% of a distance between neighboring source zones.

FIG. 4B shows two symmetric barrier zones 140a, 140b separated by a gap g2 extending over 10% of the injection cell length $l_{IC}$. The barrier zone 140a has a second offset off2 to the adjoining transistor cell TC. In the gap g2 hole injection ignites at lower currents compared to the hole injection between the barrier zone 140a and the transistor cell TC such that the snap-back voltage is reduced. Hole injection still mainly takes place in the section of the semiconductor mesa 190 between the barrier zones 140a, 140b and the source zone 110 and charge carrier plasma density is low.

Figure 4C:
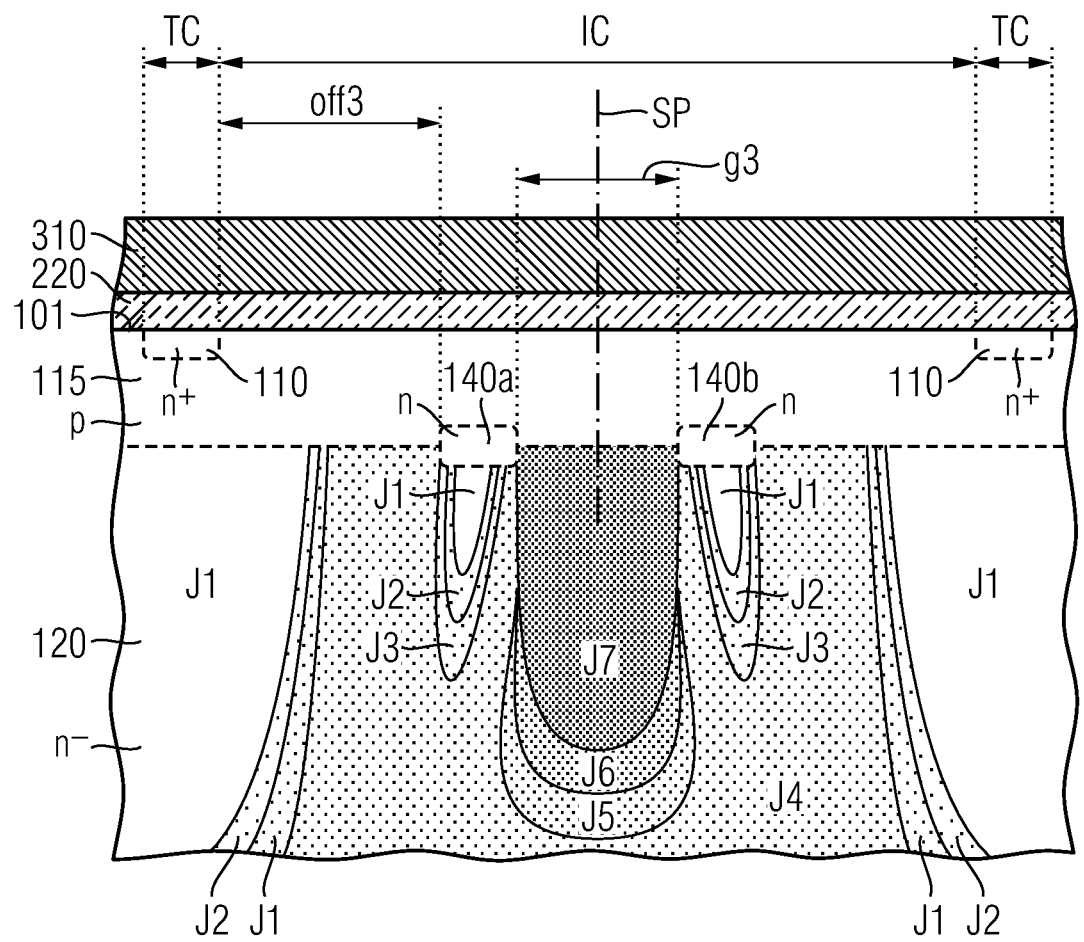
FIG. 4C is a schematic cross-sectional view showing a current density distribution in a semiconductor body of a semiconductor device including a barrier structure with two barrier zones and a gap between the barrier zones extending over 20% of a distance between neighboring source zones.

FIG. 4C shows two symmetric barrier zones 140a, 140b separated by a gap g3 extending over 20% of the injection cell length $l_{IC}$. The charge carrier density is significantly increased in the gap g3 around the center portion of the injection cell IC. Only few charge carriers are injected between the barrier zone 140a and the transistor cell TC.

Figure 4D:
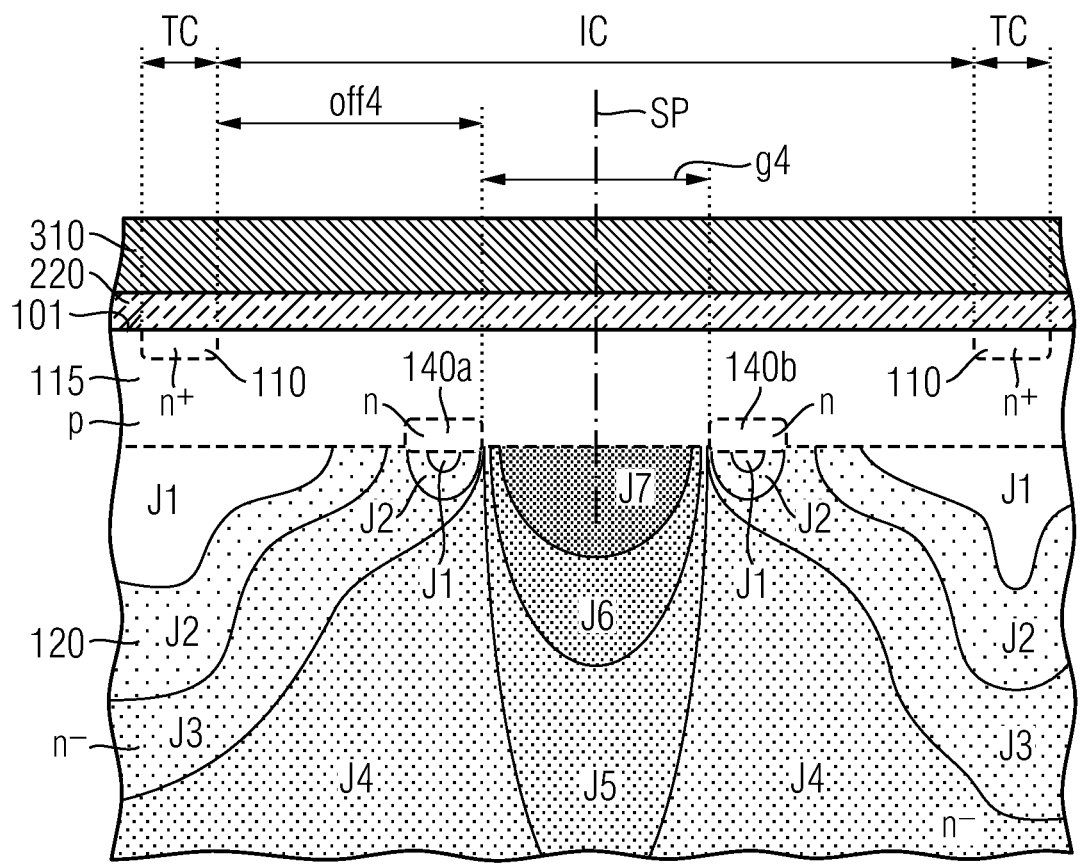
FIG. 4D is a schematic cross-sectional view showing a current density distribution in a semiconductor body of a semiconductor device including a barrier structure with two barrier zones and a gap between the barrier zones extending over 30% of a distance between neighboring source zones.

FIG. 4D shows two symmetric barrier zones separated by a gap g4 extending over 30% of the injection cell length $l_{IC}$. Holes are injected mainly in the gap g4 between the two barrier zones 140a, 140b, whereas the carrier density remains low between the barrier structure 140 and the source zones 110. The strong hole injection in the gap g4 results in a dense charge carrier plasma.

FIG. 5A shows a layout of an IGBT with a continuous barrier structure 140 between each pair of source zones 110, wherein the barrier structure 140 extends along about 40% of the injection cell length $l_{IC}$. The source zones 110 as well as the barrier structures 140 are formed in sections of semiconductor mesas 190 arranged between stripe-shaped cell trench structures 150, 160. A termination structure 690 may surround an active device area including the semiconductor mesas 190.

In FIG. 5B a contiguous barrier structure 140 extends over about 60% of the injection cell length $l_{IC}$.

FIG. 5C refers to an embodiment with two separated barrier zones 140a, 140b between pairs of neighboring source zones 110, wherein the barrier zones 140a, 140b extend in total over about 40% of the injection cell length $l_{IC}$ and the gap between the two barrier zones 140a, 140b is about 20% of the injection cell length $l_{IC}$.

FIG. 5D shows three spatially separated barrier zones 140a, 140b, 140c between pairs of neighboring source zones 110, respectively.

FIGS. 6A to 6D concern embodiments referring to a fine-tuned dopant distribution in the barrier structure 140 of an injection cell IC. The embodiments of FIGS. 6A to 6D can be combined with any of the above described embodiments.

The n-type impurity concentration inside the barrier structure 140 or inside barrier zones may be varied along the longitudinal axis of the semiconductor mesa 190 and/or along the second lateral direction parallel to the first surface 101 and perpendicular to the longitudinal axis, wherein along the longitudinal axis a maximum impurity concentration may be at least 20%, for example at least 50% higher than a minimum impurity concentration along the longitudinal axis. According to an embodiment, along the longitudinal axis of the semiconductor mesa 190, the maximum impurity concentration in the barrier structure 140 is at least ten times as high as the minimum impurity concentration. The barrier structure 140 may be obtained by using masks 600a, 600b as illustrated in FIGS. 6B and 6C, which may be used to shadow a dopant implantation carried out for implementing the barrier structure 140.

The masks 600a, 600b include several mask openings 605 with varying cross-sectional areas that may be arranged along lines parallel to the longitudinal axis. The mask openings 605 may be ellipses, ovals, circles or rectangles with or without rounded corners, by way of example.

The cross-sectional area of the mask openings 605 may decrease with increasing distance to the source zones 110 as illustrated in FIG. 6B or may decrease with decreasing distance to the source zones 110 as illustrate in FIG. 6C. The openings 605 may be arranged symmetrically with respect to a symmetry plane in the middle of the respective injection cell IC. The impurity distribution along the semiconductor mesas 190 can be adjusted by varying the cross-sectional area of the openings 605 and the distances between the openings 605.

After thermal treatment the concentration of dopants implanted through the mask openings 605 of the mask 600 into the semiconductor mesa 190 is lower where the cross-sectional area of the opening 605 was smaller and/or where the distance between the openings 605 was larger. The thermal budget delivered to the semiconductor body 100 to activate and diffuse the implanted impurities may be adjusted to prevent the impurities from diffusing into adjoining regions and to avoid the formation of a continuous barrier structure without reducing the actual impurity dose within the body zone 115.

Figure 6D:
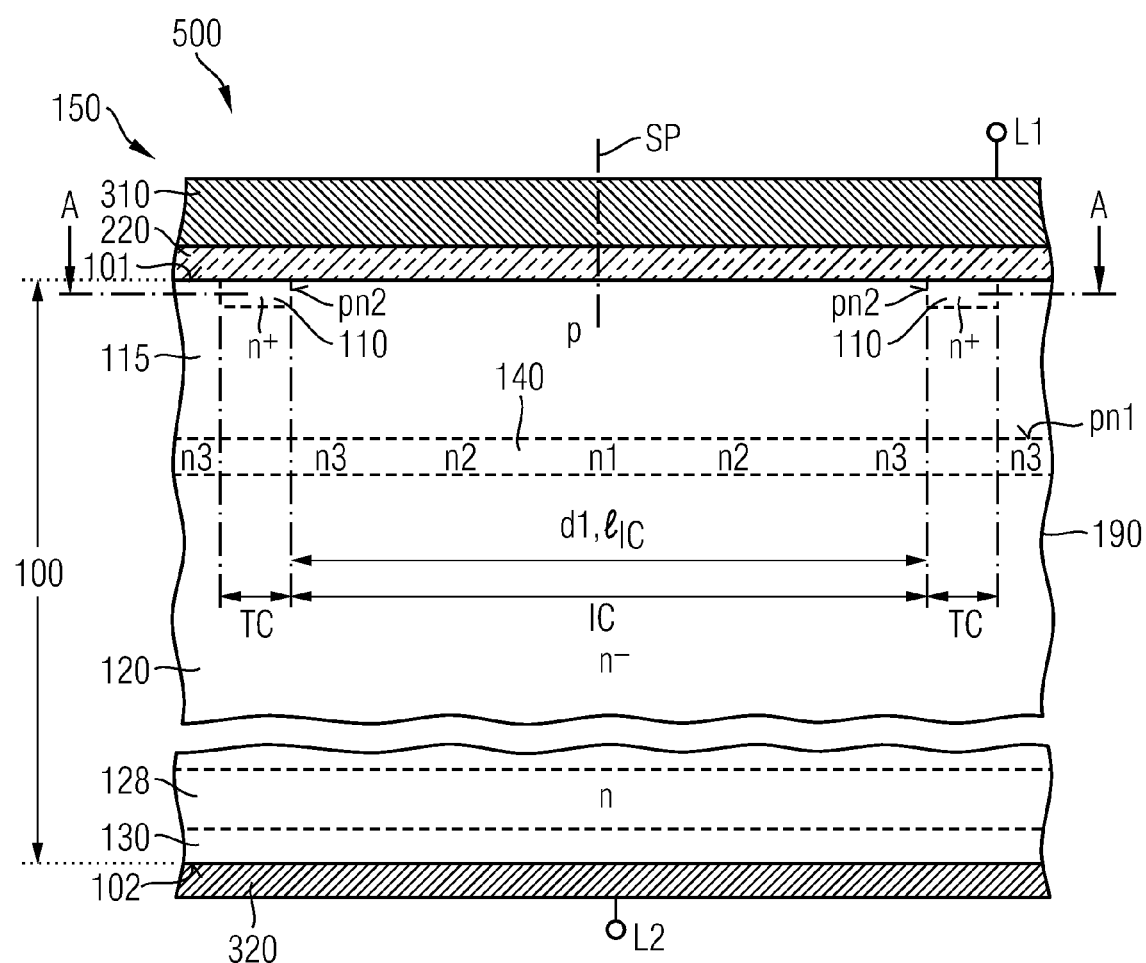
FIG. 6D is a schematic lateral cross-sectional view of a portion of a semiconductor device in accordance with an embodiment related to contiguous barrier structures with lateral variation of doping.

According to another embodiment shown in FIG. 6D a contiguous barrier layer 140 with lateral variation of doping is formed along the whole semiconductor mesa 190. The contiguous barrier layer 140 includes sections in the vertical projection of the source zones 110 and extends through transistor and injection cells TC, IC.

According to embodiments referring to semiconductor diodes and RC-IGBTs, in the barrier layer 140 an impurity concentration n3 in or close to the transistor cells TC is higher than an impurity concentration n2 which is higher than an impurity concentration n1 in the center of the injection cell IC. For example, impurity concentration n3 may exceed the impurity concentration n1 by at least 20%, for example by at least 50% of the lower value. According to an embodiment the impurity concentration n3 is at least ten times as high as the impurity concentration n1. A locally reduced impurity concentration in the barrier layer 140 may be considered in a similar way as a gap.

As regards embodiments concerning non-reverse-conducting IGBTs, an impurity concentration n3 in or close to the transistor cells TC may be lower than an impurity concentration n2 which may be lower than an impurity concentration n1 in the center of the injection cell IC. For example, impurity concentration n1 may exceed the impurity concentration n3 by at least 20%, for example by at least 50% of the lower value. According to an embodiment the impurity concentration n1 is at least ten times as high as the impurity concentration n3 close to and in the vertical projection of the source zones 110, allowing to benefit from the barrier structure 140 in the IGBT mode without negative impact of the n-type impurities of the barrier structure 140 on the threshold voltage of the transistor cells TC defined by the doping in the body zones 115.

For further details, reference is made to the description of FIGS. 1A to 1C, 2A to 2B, 3A to 3D and 5A to 5D.

In contrast to other methods for reducing the effective anode dose, for example by over-etching contact recesses into the body zones 115 after implantation or by a significantly reduced peak impurity concentration in the body zones 115, which both are difficult to control, the formation of the barrier structure 140 according to the embodiments is comparatively simple and less delicate. The barrier structure 140 facilitates a high anode doping that effectively prevents latch-up and, as a consequence, reduces the likelihood of destructive events.

FIG. 7 refers to a method of manufacturing a semiconductor device. Cell trench structures are formed that extend from a first surface into a semiconductor substrate (702). In a semiconductor mesa defined between the cell trench structures source zones are formed which are spatially separated from each other along a longitudinal axis of the semiconductor mesa (704). A buried barrier structure is formed in the semiconductor mesa at least outside a vertical projection of the source zones at a distance to the first surface (706). The buried barrier structure may be formed exclusively outside the vertical projection of the source zones. The cell trench structures may be formed before or after formation of the source zones and buried barrier structure.

A method of manufacturing a semiconductor device, comprises forming cell trench structures extending from a first surface into a semiconductor substrate, forming source zones in a semiconductor mesa between the cell trench structures, wherein the source zones are spatially separated from each other along a longitudinal axis of the semiconductor mesa, and forming a buried barrier structure in the semiconductor mesa at a distance to the first surface. Forming the buried barrier structure may comprise implanting impurities of a carrier type corresponding to a conductivity type of the barrier structure using an implant mask covering the first portions of the first surface assigned to the source zones and comprising openings arranged along the longitudinal axis. Cross-sectional areas of the openings may increase along the longitudinal axis with decreasing distance to the respective source zone and/or distances between the openings may decrease with decreasing distance to the respective source zone.

The buried barrier structure may be formed exclusively outside the vertical projection of the source zones.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a continuous semiconductor mesa formed between cell trench structures extending from a first surface into a semiconductor body, the semiconductor mesa comprising a body zone forming a first pn junction with a drift zone between the body zone and a second surface opposite to the first surface;
separated source zones formed in the semiconductor mesa at a first distance from each other along a longitudinal axis of the semiconductor mesa and forming second pn junctions with the body zone, wherein the longitudinal axis extends in a direction of the length of the semiconductor mesa and between the separated source zones the body zone directly adjoins the first surface; and
a barrier structure in a portion of the semiconductor mesa between neighboring ones of the separated source zones, the barrier structure being absent at least in a vertical projection of the separated source zones perpendicular to the first surface and forming a unipolar homojunction with the drift zone outside of the vertical projection of the separated source zones.

2. The semiconductor device of claim 1, wherein the barrier structure directly adjoins both the body zone and the drift zone and forms a unipolar homojunction with the drifts zone and a pn-junction with the body zone.

3. The semiconductor device of claim 1, wherein the barrier structure is spatially separated from the body zone and forms a unipolar homojunction with the drift zone.

4. The semiconductor device of claim 1, wherein the barrier structure is spatially separated from the drift zone and forms a pn junction with the body zone.

5. The semiconductor device of claim 1, wherein the barrier structure is formed along at most 95% of the first distance.

6. The semiconductor device of claim 1, wherein the barrier structure is formed at an offset from the separated source zones along the longitudinal axis, the offset being in a range from 0.5% to 40% of the first distance.

7. The semiconductor device of claim 1, wherein the barrier structure includes at least two barrier zones which are spatially separated from each other along the longitudinal axis.

8. The semiconductor device of claim 7, wherein a gap between the barrier zones along the longitudinal axis has a width in a range from 5% to 40% of the first distance.

9. The semiconductor device of claim 1, wherein a net impurity concentration of the barrier structure is symmetric with reference to a vertical symmetry plane between two of the separated source zones perpendicular to the first surface.

10. The semiconductor device of claim 1, wherein at least one of the cell trench structures comprises a gate structure arranged to form an inversion layer through the body zone between the source and drift zones, respectively in a first state and to form no inversion layer through the body zone in a second state.

11. The semiconductor device of claim 1, wherein the semiconductor device is or comprises an insulated gate bipolar transistor comprising a field effect transistor cell.

12. The semiconductor device of claim 1, wherein the semiconductor device is or comprises a reverse conducting insulated gate bipolar transistor that comprises a collector layer comprising first zones of a first conductivity type as well as second zones of a second conductivity type complementary to the first conductivity type between the drift zone and a second surface of the semiconductor body opposite to the first surface.

13. The semiconductor device of claim 1, wherein the barrier structure contains impurities of a deep level donor or deep double donor.

14. The semiconductor device of claim 1, wherein a mean net impurity concentration in the barrier structure is at least ten times as high as a mean net impurity concentration in the drift zone.

15. The semiconductor device of claim 1, wherein the body zone includes segments separated along a longitudinal axis of the respective semiconductor mesa by regions of the conductivity type of the separated source zones.

16. The semiconductor device of claim 15, wherein the regions of the conductivity type of the separated source zones form the barrier structure.

17. A semiconductor device, comprising:
a continuous semiconductor mesa formed between cell trench structures extending from a first surface into a semiconductor body, the semiconductor mesa comprising a body zone forming a first pn junction with a drift zone between the body zone and a second surface opposite to the first surface;
separated source zones formed in the semiconductor mesa at a first distance from each other along a longitudinal axis of the semiconductor mesa and forming second pn junctions with the body zone, wherein between the separated source zones the body zone directly adjoins the first surface and wherein the longitudinal axis is parallel to the first surface, parallel to an interface between the semiconductor mesa and the cell trench structures, and extends in a direction of the length of the semiconductor mesa; and
a barrier structure in a portion of the semiconductor mesa between neighboring ones of the separated source zones, the barrier structure being separated from the drift zone and forming a pn junction with the body zone.

18. The semiconductor device of claim 17, wherein the barrier structure is formed outside a vertical projection of the separated source zones and is absent at least in the vertical projection of the separated source zones.

19. The semiconductor device of claim 17, wherein the barrier structure is a contiguous structure including first portions outside a vertical projection of the separated source zones and second portions in the vertical projection of the separated source zones.

20. A semiconductor device, comprising:
a continuous semiconductor mesa formed between cell trench structures extending from a first surface into a semiconductor body, the semiconductor mesa comprising a body zone forming a first pn junction with a drift zone between the body zone and a second surface opposite to the first surface;
separated source zones formed in the semiconductor mesa at a first distance from each other along a longitudinal axis of the semiconductor mesa and forming second pn junctions with the body zone, wherein the longitudinal axis extends in a direction of the length of the semiconductor mesa and between the separated source zones the body zone directly adjoins the first surface; and a contiguous barrier structure of the conductivity type of the separated source zones, the contiguous barrier structure being disposed in the semiconductor mesa, being not interrupted along the longitudinal axis and forming, in the semiconductor mesa, a unipolar homojunction with the drift zone, wherein a net impurity concentration of the barrier structure continuously or in steps varies by at least 20% along the longitudinal axis between centers of two neighboring ones of the separated source zones.

21. The semiconductor device of claim 20, wherein the semiconductor device is an RC-IGBT or a semiconductor diode and the net impurity concentration in the barrier structure increases along the longitudinal axis with decreasing distance to the separated source zones.

22. The semiconductor device of claim 20, wherein the semiconductor device is a non-RC-IGBT and the net impurity concentration in the barrier structure decreases along the longitudinal axis with decreasing distance to the separated source zones.

23. The semiconductor device of claim 20, wherein the net impurity concentration of the barrier structure is symmetric with reference to a vertical symmetry plane between the two neighboring ones of the separated source zones perpendicular to the first surface.

24. The semiconductor device of claim 20, wherein the contiguous barrier structure is present in the vertical projection of the separated source zones.

* * * * *